(12) United States Patent
Lee et al.

(10) Patent No.: US 7,088,133 B2
(45) Date of Patent: *Aug. 8, 2006

(54) PROGRAMMABLE LOGIC DEVICE WITH HIGH SPEED SERIAL INTERFACE CIRCUITRY

(75) Inventors: Chong H Lee, San Ramon, CA (US); Reza Asayesh, Menlo Park, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/302,722

(22) Filed: Dec. 13, 2005

(65) Prior Publication Data

US 2006/0095605 A1    May 4, 2006

Related U.S. Application Data

(63) Continuation of application No. 11/128,916, filed on May 12, 2005, now Pat. No. 7,002,368, which is a continuation of application No. 10/643,276, filed on Aug. 18, 2003, now Pat. No. 6,911,841, which is a continuation of application No. 10/093,785, filed on Mar. 6, 2002, now Pat. No. 6,650,140.

(60) Provisional application No. 60/277,150, filed on Mar. 19, 2001.

(51) Int. Cl.
*H03K 19/177* (2006.01)

(52) U.S. Cl. .......................... 326/39; 326/38

(58) Field of Classification Search ............ 326/38–41
See application file for complete search history.

(56) References Cited

U.S. PATENT DOCUMENTS

| 3,473,160 | A | 10/1969 | Wahlstrom | 326/41 |
|---|---|---|---|---|
| 4,486,739 | A | 12/1984 | Franaszek et al. | 341/59 |
| 4,972,470 | A | 11/1990 | Farago | 713/192 |
| 5,379,382 | A | 1/1995 | Work et al. | 710/63 |
| 5,402,014 | A | 3/1995 | Ziklik et al. | 326/37 |
| 5,457,784 | A | 10/1995 | Wells et al. | 710/9 |
| 5,557,219 | A | 9/1996 | Norwood et al. | 326/49 |
| 5,574,388 | A | 11/1996 | Barbier et al. | 326/41 |
| 5,689,195 | A | 11/1997 | Cliff et al. | 326/41 |
| 5,907,566 | A | 5/1999 | Benson et al. | 714/798 |
| 6,005,412 | A | 12/1999 | Ranjan et al. | 326/63 |
| 6,038,400 | A | 3/2000 | Bell et al. | 710/11 |
| 6,122,747 | A | 9/2000 | Krening et al. | 713/323 |

(Continued)

FOREIGN PATENT DOCUMENTS

EP    1 248 372    10/2002

(Continued)

OTHER PUBLICATIONS

Bursky, Dave, "Higher-Throughput DSP Chips Take on complex Applications," Electronic Design, May 25, 1988.

(Continued)

*Primary Examiner*—Don Le
(74) *Attorney, Agent, or Firm*—Robert R. Jackson; Fish & Neave IP Group Ropes & Gray LLP

(57) ABSTRACT

A programmable logic device ("PLD") includes high speed serial interface ("HSSI") circuitry that can support several high speed serial ("HSS") standards. Examples of the standards that can be supported are XAUI, InfiniBand, 1G Ethernet, FiberChannel, and Serial RapidIO. The HSSI circuitry may be partly programmable to support these various standards. In some cases control may come from the associated PLD core circuitry. Also in some cases some of the interface functions may be performed in the PLD core circuitry.

30 Claims, 15 Drawing Sheets

U.S. PATENT DOCUMENTS

| | | | | |
|---|---|---|---|---|
| 6,128,673 | A | 10/2000 | Aronson et al. | 710/22 |
| 6,131,125 | A | 10/2000 | Rostoker et al. | 709/250 |
| 6,145,020 | A | 11/2000 | Barnett | 710/8 |
| 6,150,837 | A | 11/2000 | Beal et al. | 326/39 |
| 6,185,641 | B1 | 2/2001 | Dunnihoo | 710/56 |
| 6,240,471 | B1 | 5/2001 | Schlueter et al. | 710/62 |
| 6,270,350 | B1 | 8/2001 | Christopher | 434/69 |
| 6,370,603 | B1 | 4/2002 | Silverman et al. | 710/72 |
| 6,388,591 | B1 | 5/2002 | Ng | 340/100 |
| 2001/0033188 | A1 | 10/2001 | Aung et al. | 327/141 |

FOREIGN PATENT DOCUMENTS

| | | |
|---|---|---|
| GB | 2 323 000 | 9/1998 |

OTHER PUBLICATIONS

Leonard, Milt, "Digital System Design (Mastering New Devices and Design Methodologies)," Electronic Design, vol. 37, No. 1, p. 88-95, Jan. 12, 1989.

Abe, Koki et al., "A Microcomputer Implementation of PLA Function and Its Use in a Laboratory Dealing with Arithmetic Algorithms," IEEE Transactions on Education, vol. 32, No. 2, pp. 129-138, May 1989, "High-Speed Serial Interface Micro Channel Adapter," IBM Technical Disclosure Bulletin, vol. 34, No. 7A, Dec. 1991.

Clark, Barry M., "Improve Reliability by Rigging PC Boards for In-Circuit Programming," EDN, vol. 37, No. 8, p. 135-140 Apr. 9, 1992.

J.F. Ewen et al. "Single-Chip 1062 Mbaud CMOS Transceiver For Serial Data Communication" IEEE: International Solid-State Circuits Conference, Feb. 15, 1995, pp. 32-33, 36.

Gallant, John, "High-Density PLDs," EDN, vol. 40, No. 6, p. 31-35, Mar. 16, 1995.

"Synchronous High Speed Serial Interface Clocking," IBM Technical Disclosure Bulletin, vol. 38 No. 04, Apr. 1995.

Bursky, Dave, "Lower-Power and Faster Devices Tackle Multimedia Needs," Electronic Design, vol. 44, No. 9, p. 90-96, May 1, 1996.

Press Release, Lucent Technologies, Lucent Technologies ORCA Series to be Supported by Synopsys' FPGA Express (Jun. 3, 1996).

Press Release, Lucent Technologies, Lucent Announces Plans for 225,000 Gate FPGAs with System Level Functions and Field Programmable System Chips (Oct. 21, 1996).

Press Release, Lucent Technologies, Lucent Technologies' New Series 3 Family of FPGSs Offers System-Level Features for Faster Development (Mar. 3, 1998).

Press Release, Lucent Technologies, Lucent Technologies, Combines FPGA, Standard-Cell Logic on Single Silicon Chip for High Performance, Flexibility (May 11, 1998).

"Atmel Corp.—History & Debt Report," Atmel Corp.,—History and Debt Report, Dec. 26, 1998.

Dipert, Brian, "The Best (or Worst?) of Both Worlds (Hybrid Application-Specific ICs/Programmable Logic Devices)," EDN, vol. 44, No. 23, p. 139, Nov. 1, 1999.

"Protocol Independent Gigabit Backplane Transceiver Using Lucent ORT4622/ORT8850 FPSCs", Application Not, Jun. 2000, Lucent Technologies Inc., pp. 1-10.

"Lucent Technologies Boosts Field-Programmable Gate Array—FPGA Performance for Broadband Communications Applications," business Wire, p. 1, Jul. 3, 2000.

"QuickFC-PCI Interface," APPNote #54, QuickLogic Customer Engineering, Aug. 30, 2000.

Bursky, Dave, "FPGA Combines Multiple Serial Interfaces and Logic," Electronic Design, vol. 48, No. 20, p. 74, Oct. 2, 2000.

"Lucent Introduces 10Gb/s Ethernet FPGAs", Programmable Logic News and Views, Electronic Trend Publications, Inc., vol. IX, No. 11, Nov. 2000, pp. 7-8.

Press Release, Actel Corporation, Actel Announces Five Productivity Enhancing IP Cores For SX, SX-A And eX Devices (Nov. 17, 2000).

Souza, Crista, "Lucent FPSCs Aid 10-Gbit Ethernet Design," Electronic Buyers' News, p. 41, Nov. 20, 2000.

"Cypress to Mix Programmable Logic, high-Speed Serial I/O in New Chip Series," ComSoc News, Dec. 18, 2000.

"Cypress Interface to Bypass Backplane Bottlenecks—Serial Devices Address Bus Problems Such as Noise, Speed, and Scalability," EBN, p. 39, Jan. 1, 2001.

"What's Making Waves in the Market," Fiber Optics News, vol. 21, No. 2, jan. 8, 2001.

"ORCA® ORT8850 Field-Programmable System Chip (FPSC) Eight-Channel x 850 Mbits/s Backplace Transceiver," Product Brief, Agere Systems, Jul. 2001.

"ORCA® ORT8850 Field-Programmable System Chip (FPSC) Eight-Channel x 850 Mbits/s Backplane Transceiver," Data Sheet, Agere Systems, Aug. 2001.

Moore, Michael, "Speeding Up Your Backplane," Circuit Cellar Online, pp. 1-6, Nov. 2001.

Gomes, Luis, "Introducing Programmable Logic Devices into Digital Design," IEEE, pp. 73-74, 2001, no month.

Virtex-II Pro Platform FPGA Handbook, UG012 (v1.0) Jan. 31, 2002, Xilinx, Inc., pp. 1-6, 27-32, 121-126, and 162-180.

"ORCA ORT82G5 0.622/1.0-1.25/2.0-2.5/3.125 Gbits/s Backplane Interface FPSC", Product Brief, Feb. 2001, Lucent Technologies Inc., pp. 1-8.

Rocket I/O Transceiver User Guide, UG024 (v1.2) Feb. 25, 2002, Xilinx, Inc., pp. 1-106.

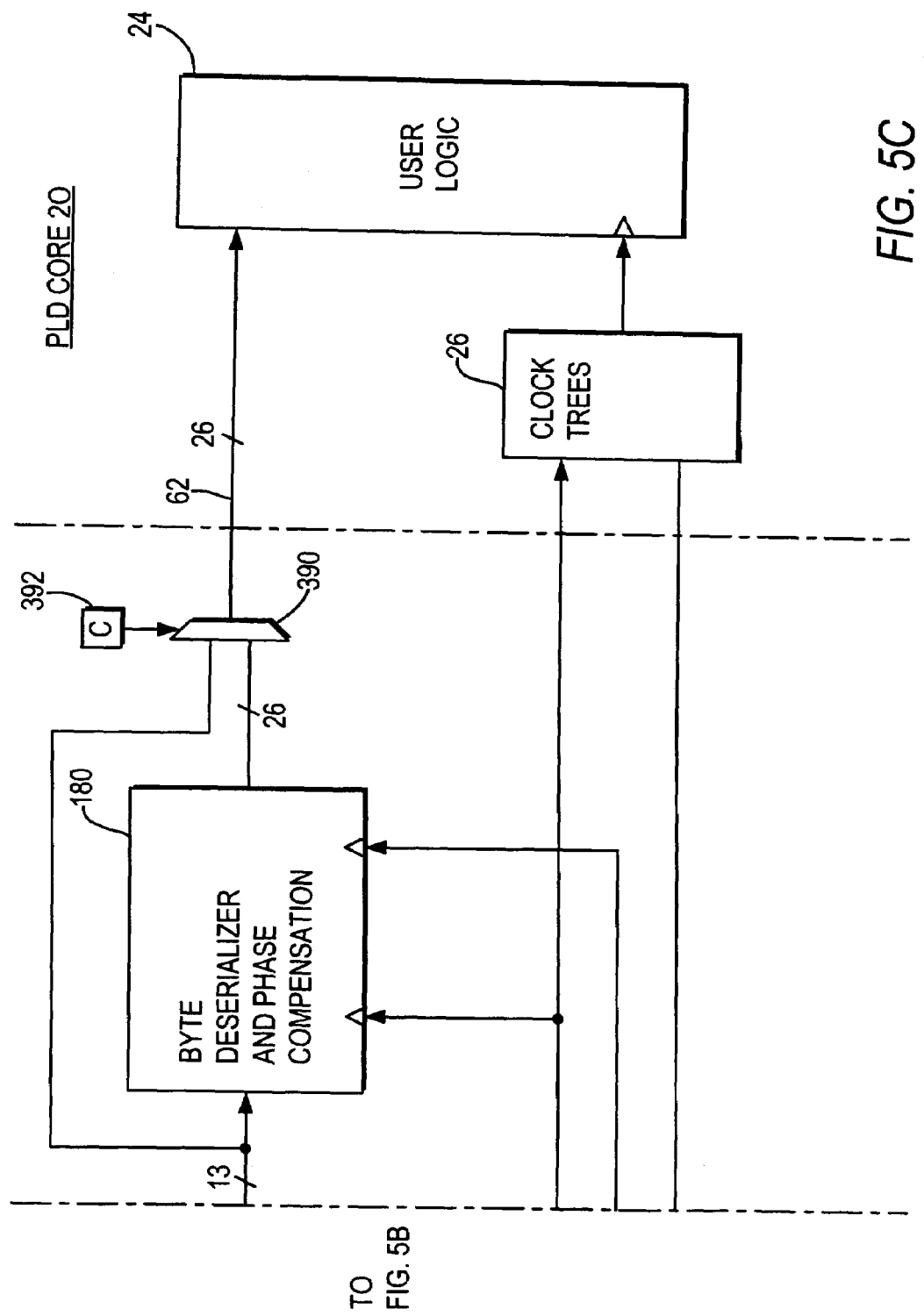

US 7,088,133 B2

PROGRAMMABLE LOGIC DEVICE WITH HIGH SPEED SERIAL INTERFACE CIRCUITRY

CROSS-REFERENCE TO RELATED APPLICATION

This application is a continuation of U.S. patent application Ser. No. 11/128,916, filed May 12, 2005 is now a U.S. Pat. No. 7,002,368, which is a continuation of U.S. patent application Ser. No. 10/643,276, filed Aug. 18, 2003 (now U.S. Pat. No. 6,911,841), which is a continuation of U.S. patent application Ser. No. 10/093,785, filed Mar. 6, 2002 (now U.S. Pat. No. 6,650,140), all of which are hereby incorporated by reference herein in their entireties. This application claims the benefit of U.S. provisional patent application No. 60/277,150, filed Mar. 19, 2001, which is hereby incorporated by reference herein in its entirety.

BACKGROUND OF THE INVENTION

High speed serial digital communication is constantly increasing in importance. The number of different industry standards for such communication is also increasing. Programmable logic device ("PLD") technology is well known for its ability to allow one common hardware design (embodied in an integrated circuit) to be programmed to meet the needs of many different applications. PLDs with a given hardware design can be manufactured in large quantities at low cost. Each user then programs PLDs of that kind to meet that user's particular needs. The user does not have to do a custom integrated circuit design, with the attendant high cost, delay, and difficulty of revision if modifications are subsequently needed.

To facilitate the use of PLDs in applications involving high speed serial digital communication, it would be desirable to provide PLDs with high speed serial interface ("HSSI") circuitry. One problem in doing this, however, is that there is now a large number of high speed serial ("HSS") communication standards or somewhat related, but perhaps non-standard, protocols that users of PLDs may want to employ. Including a large number of different HSSI circuits on a PLD is wasteful, uneconomical, and very difficult or even impossible if the number of standards or protocols to be supported becomes very large. On the other hand, manufacturing the same basic PLD circuitry in several different versions, each with different HSSI circuitry to meet a different HSS standard or protocol, is also uneconomical because it is contrary to the "economy of scale" benefit otherwise associated with manufacturing one common PLD circuit design in large volume.

SUMMARY OF THE INVENTION

In accordance with the present invention, PLD circuitry includes at least some of the circuit components that are needed to provide several different HSSIs. These HSSI circuit components are hard-wired to at least a large extent, although in at least some cases at least some of their functions are either programmably controllable or controllable by dynamic signals (e.g., from the PLD core circuitry). Interconnections among the HSSI circuit components may also be programmably controllable or dynamically controllable. By making use of appropriate ones of the available HSSI circuit components (e.g., by programmable or dynamic selection), and by appropriately controlling (e.g., programmably or dynamically controlling) the selected HSSI circuit components, the circuitry can be made to perform according to any one of several possible HSS communication standards or other generally similar protocols. In some cases, some of the functions required to implement certain HSSIs may be wholly or partly performed by the PLD core circuitry. The HSSI circuit components that are provided may be for HSSI receiver circuitry, HSSI transmitter circuitry, or both.

Further features of the invention, its nature and various advantages will be more apparent from the accompanying drawings and the following detailed description.

BRIEF DESCRIPTION OF THE DRAWINGS

FIGS. 5A–5C are collectively a more detailed, but still simplified schematic block diagram of circuitry of the type shown in FIG. 3.

DETAILED DESCRIPTION

Figure 1:
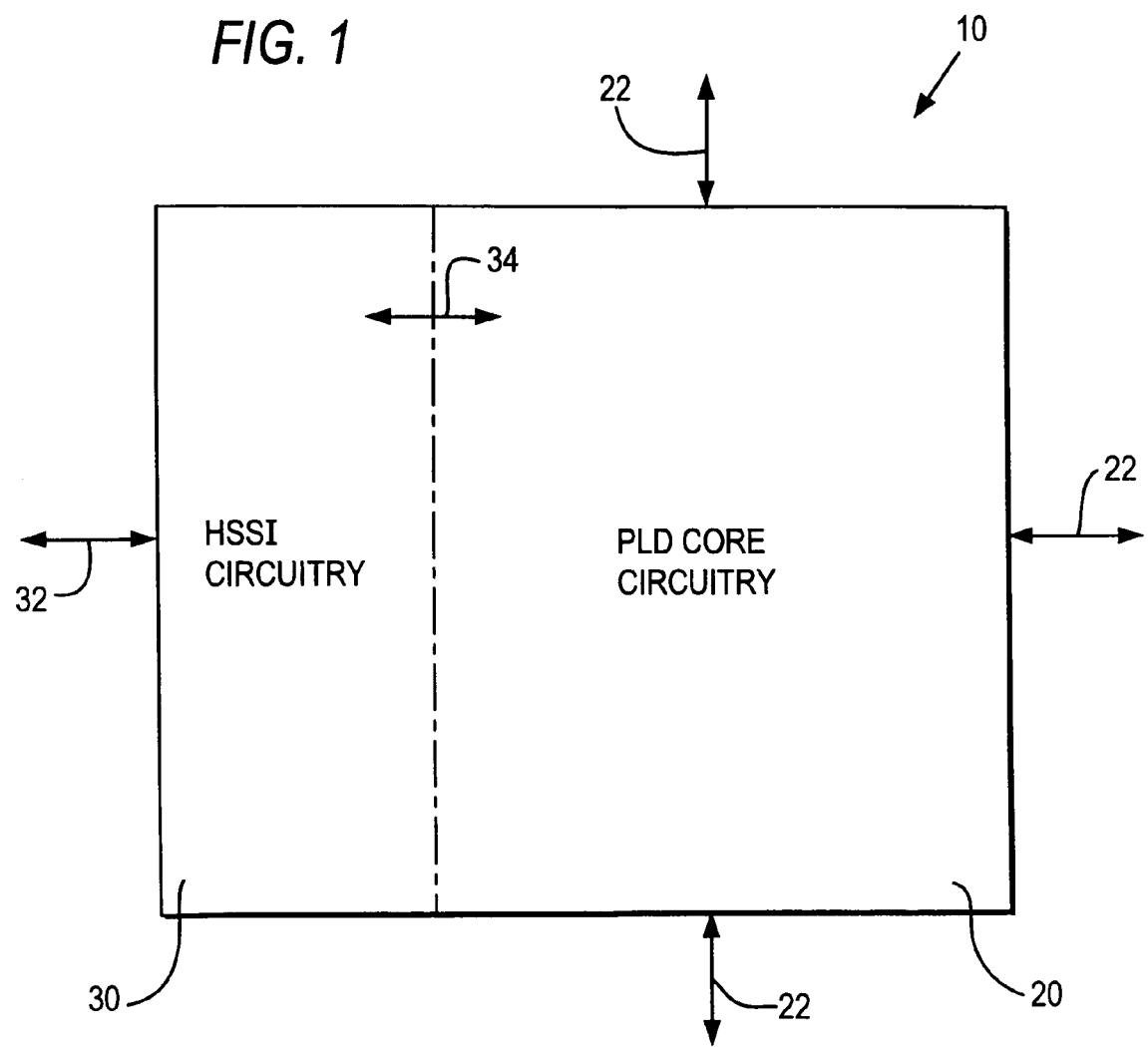
FIG. 1 is a simplified block diagram of an illustrative embodiment of a programmable logic integrated circuit device ("PLD") constructed in accordance with the invention.

An illustrative PLD 10 constructed in accordance with the invention is shown in FIG. 1. PLD 10 is an integrated circuit that includes PLD core circuitry 20 and high speed serial interface ("HSSI") circuitry 30. PLD core circuitry 20 can be typical programmable logic circuitry of any of several known types and constructions. In accordance with this invention, HSSI circuitry 30 includes various HSSI circuit components that are hard-wired (at least to a large extent) and are therefore dedicated to performing various functions required to implement HSSI operations. HSSI circuitry 30 may be used to receive one or more high speed serial ("HSS") signals via connection(s) 32 and to pass the information thus received on to PLD core circuitry 20 in a form that is more readily usable by the core circuitry. Alternatively or additionally, HSSI circuitry 30 may be used to output via connection(s) 32 one or more HSS signals indicative of information received from PLD core circuitry 20. Leads 34 are used to convey signals between PLD core circuitry 20 and HSSI circuitry 30. PLD core circuitry 20 may also input and/or output other, typically non-HSSI signals via leads 22.

Although the principles of this invention are applicable to many HSSI communication standards, and therefore to many types of HSSI circuitry, the invention will be fully understood from the following explanation, which mainly concentrates on several HSSI standards that employ conventional eight-bit/ten-bit ("8B/10B") coding/decoding. (For information regarding 8B/10B coding, see Franaszek et al. U.S. Pat. No. 4,486,739.) The illustrative HSSI standards that the illustrative circuitry shown herein supports include the standards known as (1) XAUI, (2) InfiniBand, (3) 1G Ethernet, (4) FiberChannel, and (5) Serial RapidIO. This circuitry will also support 10G Ethernet, and it will support many non-industry-standard protocols that are modifications of the true industry-standard protocols. Some users may sometimes want to devise and employ such variants of industry standards, and many such variants can be supported by the circuitry of this invention. The true industry standards (e.g., XAUI, InfiniBand, etc.) are all well known to those skilled in the art and are fully documented in the publicly available information put out by the industry committees that developed and maintain those standards. It will not be necessary to provide full details of any of those standards herein.

In the illustrative embodiment shown and described herein XAUI is used as a starting-point standard. This is because XAUI tends to require at least as much functionality as any of the other supported standards. The other standards can therefore be implemented using the same or similar HSSI circuit components, or subsets of those components, that are provided in circuitry 30 to support XAUI. In the illustrative embodiment shown herein the XAUI interface is substantially fully implementable in HSSI circuitry 30. For some of the other standards, part of the interface is implemented in HSSI circuitry 30 and part of the interface is implemented in PLD core circuitry 20.

In general terms the XAUI standard specifies four channels of clock data recovery ("CDR") data encoded using 8B/10B coding. The channels may operate at up to 3.125 gigabits per second ("Gbps"). The channels are used in rotating order to transmit successive bytes of information. There are continuous transmissions of data of specified maximum length, separated by "idle" intervals of minimum length. Specified special characters are transmitted during the idle intervals to enable the receiver to get ready to receive the next transmission of data.

Figure 2:
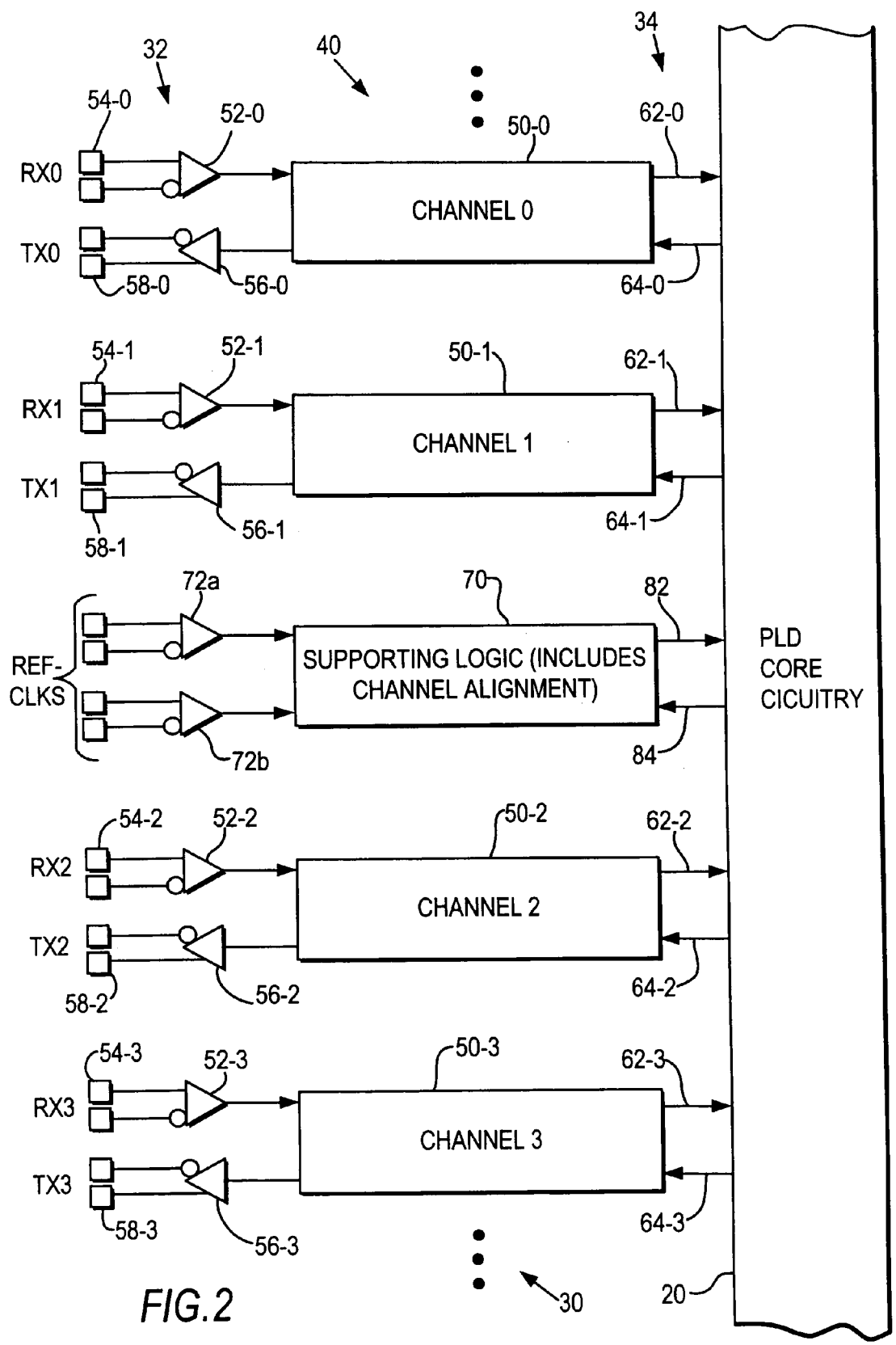
FIG. 2 is a more detailed, but still simplified schematic block diagram of a representative portion of the circuitry shown in FIG. 1.

Because XAUI is a four-channel standard, HSSI circuitry 30 in FIG. 1 is basically organized into one or more "quads" of four channels each. As shown in FIG. 2, a representative quad 40 includes four data channels 0–3 (also identified as 50-0 through 50-3) and one supporting logic circuit 70. Each data channel 50 can receive one data stream via associated driver 52 and/or can output one data stream via associated driver 56. Each of drivers 52 and 56 is preferably a differential driver because the HSSI standards of interest in connection with the present illustrative embodiment receive ("RX") and transmit ("TX") information using differential signalling. Each receiver driver 52 has an associated pair of input pins 54, and each transmitter driver 56 has an associated pair of output pins 58. Each channel 50 includes the circuitry required to at least partly convert a received HSS signal from HSS form to a form more suitable for application to PLD core circuitry 20 via associated leads 62. For example, each channel 50 may receive successive serial bytes of 10 bits each (because of 8B/10B encoding) and may output to PLD core circuitry 20 successive parallel bytes of 8 bits each. Each channel 50 also includes the circuitry required to at least partly convert signals received from PLD core circuitry 20 to HSS form for output transmission via the associated transmitter driver 56. For example, each channel 50 may receive successive parallel 8-bit bytes of data via associated leads 64, and may convert those bytes to successive serial 10-bit bytes output via the associated transmitter driver 56.

The supporting logic 70 included in each quad 40 includes circuitry that is usable to support certain operations in all four of the associated data channels. For example, one phase locked loop ("PLL") circuit receiving a reference clock ("REFCLK") signal may be used to produce candidate recovered clock signals for use by each of channels 50 in that channel's operations to produce a final recovered clock signal from the HSS CDR signal received by that channel 50. As another example, because certain HSS standards allow "skew" between received data channels, circuit 70 includes circuitry for determining how much the four channels of received HSS data are skewed relative one another as part of the operations required to compensate for such skew. (Skew is differential transmission delay between parallel transmission lines.) Circuit 70 may receive REFCLK signals via drivers 72, and may communicate with PLD core 20 via leads 82 and/or 84.

Figure 3:
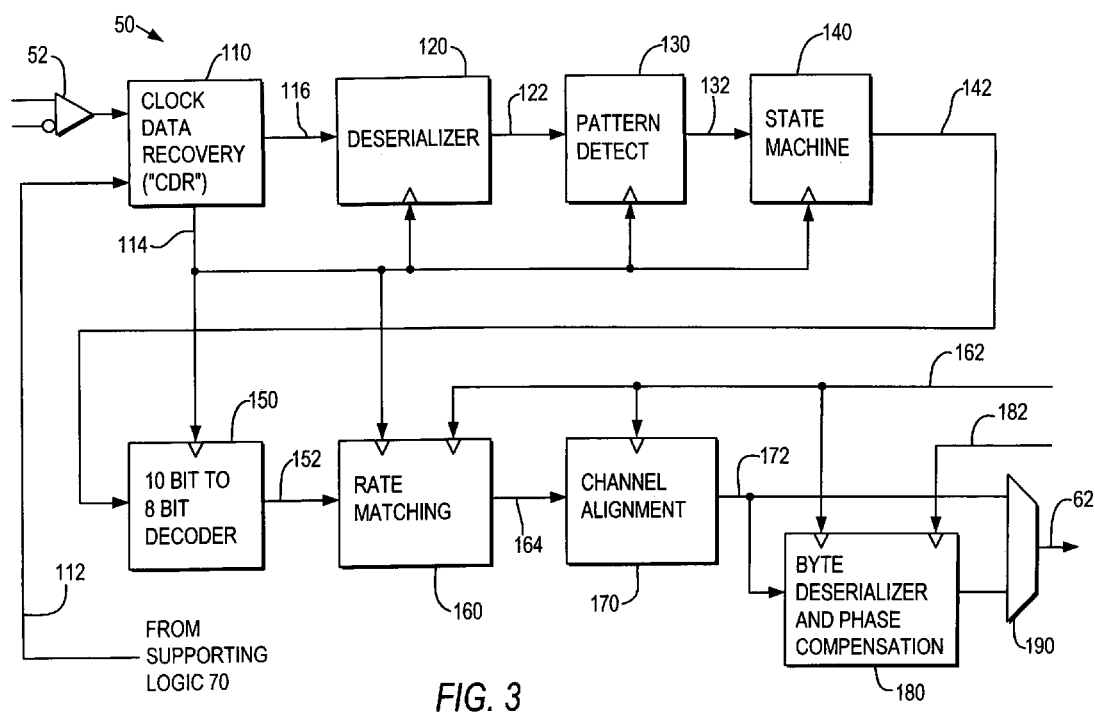
FIG. 3 is a more detailed, but still simplified schematic block diagram of a representative portion of the circuitry shown in FIG. 2.

FIG. 3 shows an illustrative embodiment of representative portions of FIG. 2 in somewhat more detail. In particular, FIG. 3 shows the receiver portion of one representative channel 50. In some cases some of the elements shown in FIG. 3 may be partly embodied in supporting logic 70 and are therefore shared by all four channels 50 in the quad associated with that supporting logic 70.

CDR circuitry 110 receives a single serial data stream from receiver driver 52. CDR circuitry 110 may also receive several candidate recovered clock signals via leads 112 from PLL circuitry in supporting logic 70. As mentioned above, this PLL circuitry typically operates on one of the REFCLK signals applied to circuitry 70 as shown in FIG. 2. (See, for example, Aung et al. U.S. patent application Ser. No. 09/805,843, filed Mar. 13, 2001, for more information regarding how this aspect of supporting logic 70 may be constructed and operate to produce several candidate recovered clock signals from a REFCLK signal. The Aung et al. reference also includes additional details regarding how CDR circuitry 110 may be constructed and operate to use such candidate recovered clock signals to produce a final recovered clock signal and also to produce a retimed data signal from the input CDR signal. Of course, CDR circuitry 110 may also be constructed and operate in different ways, if desired.) CDR circuitry 110 uses the candidate recovered clock signals from supporting logic 70 to recover a clock signal from the CDR data signal it receives. CDR circuitry 110 outputs this recovered clock signal via lead 114. CDR circuitry 110 also produces a retimed data signal from the CDR data signal it receives, and it outputs that retimed data signal via lead 116. (The "recovered clock signal" on various parts of network 114 can have either the bit rate frequency or the byte rate frequency. One or more dividers (not shown in FIG. 3, but like element 410 in FIG. 5A) can be included in network 114 to convert from the bit rate to the byte rate. For example, deserializer 120 needs both the bit rate and the byte rate versions of the recovered clock signal, but elements 130, 140, 150, and 160 need only the byte rate version.)

Deserializer circuitry 120 converts the serial retimed data output signal of CDR circuitry 110 to several parallel data signals on leads 122. To do this deserializer circuitry 120 uses the recovered clock signal on lead 114. (See again the last-mentioned reference for an example of how deserializer circuitry 120 may be constructed and may operate.) For example, successive bytes of data output in serial form by CDR circuitry 110 may be converted to successive parallel bytes of data output by deserializer 120. Because XAUI and many of the other HSS standards supported by the circuitry of FIG. 3 use 8B/10B coding, deserializer 120 is preferably designed to receive serial bytes of 10 bits of data and to output parallel bytes that also have 10 bits of data. It will be understood, however, that any byte length can be used, and that deserializer 120 can be constructed to work with any desired byte length(s).

The parallel data output by deserializer 120 is applied to pattern detect circuitry 130. Pattern detect circuitry 130 works with state machine circuitry 140 to detect particular patterns in the data output by deserializer 120 to find byte boundaries in the incoming CDR data. In XAUI and many of the other standards supported by the circuitry of FIG. 3, special characters are transmitted repeatedly (although typically at spaced intervals) during idle intervals. Pattern detect circuitry accumulates enough output data from deserializer 120 to make sure that such a special character can be detected, even though deserializer 120 may initially not be properly synchronized with byte boundaries in the incoming CDR data. For example, pattern detect 130 may be able to hold two successive "bytes" (i.e., 20 bits) output by deserializer 120, and may look for a special character anywhere within those 20 bits. State machine 140 keeps track of each such detection of a special character. When a sufficient number of special characters have been detected, all at the same location in a corresponding number of 20-bit groups, elements 130/140 can produce output signals indicating that they have detected the byte boundaries in the incoming CDR signals. These output signals of elements 130/140 can be used to adjust the operation of deserializer 120 so that the deserializer thereafter produces output signals that are truly synchronized with the byte boundaries in the incoming CDR signal.

As a specific example of the foregoing, suppose that elements 130/140 detect special characters at bit positions 5–14 out of bit positions 0–19 in the 20 bits held by pattern detect circuitry 130. This would mean that deserializer 120 is not synchronized with the byte boundaries in the incoming CDR data, but instead needs to shift its deserialization operation by five recovered clock cycles (e.g., to shift its output bytes from bit positions 5–14 to bit positions 0–9 (or to bit positions 10–19) in pattern detect circuitry 130). Such a shift in deserialization operation can easily be accomplished, for example, by holding in reset a recovered clock divider circuit in deserializer 120 for the appropriate number of recovered clock signal cycles. After the recovered clock divider circuit has been released from reset, deserializer 120 will resume operation outputting bytes that are properly synchronized with the byte boundaries in the incoming CDR signal.

After the operations described above, the output signals of elements 130/140 on leads 142 are successive parallel bytes of data that have been properly recovered (i.e., in accordance with the proper byte boundaries) from the incoming CDR signal. Each successive 10-bit byte on leads 142 is applied to 10 bit to 8 bit decoder circuitry 150. This circuitry converts each successive 10-bit byte to the corresponding 8-bit byte (e.g., in accordance with the scheme described in above-mentioned Franaszek et al. U.S. Pat. No. 4,486,739). Circuitry 150 outputs successive, parallel, 8-bit bytes via leads 152.

The data output by circuitry 150 is applied to rate matching circuitry 160. The purpose of circuitry 160 is to take care of the possibility that there may be a small difference between the frequency of the oscillator used in the circuitry that generated the CDR signal received by the circuitry shown herein and the frequency of the oscillator used more locally with the circuitry shown herein (e.g., to generate the REFCLK signals shown in FIG. 2). Thus rate matching circuitry 160 may include memory circuitry that stores successive bytes from circuitry 150 in synchronism with the recovered clock signal on lead 114, but that outputs data via leads 164 in synchronism with a local oscillator clock signal on lead 162. The recovered clock signal on lead 114 has a frequency determined by the frequency of the remote oscillator in the circuitry that originated the CDR signal applied to circuitry 110. The signal on lead 162 has a frequency determined by the frequency of a local oscillator. Rate matching circuitry 160 therefore acts as a buffer to accommodate possible small differences between the local and remote oscillator frequencies. (One possible ultimate source of the signal on lead 162 can be the same as the ultimate source of an above-mentioned REFCLK signal.)

In connection with rate matching circuitry 160 it should be noted that to avoid excessive accumulation of local and remote oscillator frequency difference, it may be necessary for the rate matching circuitry to occasionally delete a received character from the data passed on via lead 164, or to occasionally artificially insert a character into the data passed on via lead 164. This can be done during idle intervals.

The output signals 164 of rate matching circuitry 160 are successive 8-bit bytes of data properly decoded from the input CDR signal and synchronized with a local oscillator. However, these bytes of data are from only one CDR transmission channel, and XAUI (and other standards or protocols supported by the circuitry of this invention) permits interleaving of data in four such CDR channels. The interleaving scheme employed in XAUI, for example, involves routing successive bytes of starting data to different ones of the four channels in turn on a repeating basis. The following table illustrates the interleaving used.

| Byte No. | Channel No. |
| --- | --- |
| 0 | 0 |
| 1 | 1 |
| 2 | 2 |
| 3 | 3 |
| 4 | 0 |
| 5 | 1 |
| 6 | 2 |
| 7 | 3 |

-continued

| Byte No. | Channel No. |
|---|---|
| 8 | 0 |
| 9 | 1 |
| 10 | 2 |
| ... | ... |

Each of the four CDR channels may have somewhat different amounts of delay. This is sometimes referred to as the channels being skewed relative to one another. Because of such skew, re-interleaving in the proper order the bytes received via the various channels may not be done properly without an operation called channel alignment.

In the circuitry shown in FIG. 3 channel alignment circuitry 170 performs the channel alignment function in combination with the corresponding circuitry in the other channels in the quad and the relevant portion of the supporting logic 70 of the quad. Although channel alignment circuitry 170 could alternatively be constructed in other ways, one illustrative construction is as follows. In each channel, alignment circuitry 170 includes shift registers for registering several successive bytes received via leads 164 and for shifting those bytes along the shift register chain. The contents of each shift register stage are examined for a special alignment character. (During idle intervals, alignment characters are transmitted periodically in all four channels.) When an alignment character is detected in one of the shift register stages in all four channels, channel alignment can be based on which of the shift register stages in the four channels concurrently contain the channel alignment character. For example, if each of channel alignment circuits 170 includes four shift register stages, and if the channel alignment character is concurrently found in the fourth shift register stage in channel 0, in the first shift register stage in channel 1, in the third shift register stage in channel 2, and also in the third shift register stage in channel 3, one knows that future actual data from the four channels can be re-interleaved as follows: a byte from channel 0, shift register stage 4 should be followed by a byte from channel 1, shift register stage 1, which should be followed by a byte from channel 2, shift register stage 3, which should be followed by a byte from channel 3, shift register stage 3, and then the re-interleaving sequence should begin again.

As is apparent from FIG. 3, channel alignment circuitry 170 operates on local oscillator clock signal 162. Although not shown in FIG. 3, channel alignment circuitry 170 in all four channels may be supported by a state machine (conceptually similar to state machine 140) (e.g., in supporting logic 70) for making sure that channel alignment is based on sufficiently repeated detection of the same conditions. As in the case of state machine 140, this may be done to ensure that channel alignment is based on stable circuit operation, and to increase the reliability of the channel alignment function.

Channel alignment circuitry 170 outputs channel-aligned data via leads 172. This data is applied to one set of inputs of programmable logic connector ("PLC") 190, and also to byte deserializer and phase compensation circuitry 180. One of the functions of circuitry 180 is to assemble two successive bytes from leads 172 for application in parallel to the other set of inputs of PLC 190. PLC 190 is programmable or otherwise controllable to pass the signals on either of its input sets to output terminals 62 and thus to PLD core 20 (FIGS. 1 and 2). Circuitry 180 may be used to assemble two bytes in parallel for situations in which the serial byte rate is too great for PLD core 20. PLC 190 allows circuitry 180 to be either used or bypassed, as desired.

Another possible function of circuitry 180 is phase compensation. If the phase of the clock signal on lead 162 is different from the phase of a PLD core clock signal on lead 182, the phase compensation portion of circuitry 180 buffers the data passing through that circuitry so that it is output having the proper phase relationship to the PLD core clock signal. (Again, the ultimate source of the signals on leads 162 and 182 may be the same, but a phase shift may result from different routing of these two signals.)

Figure 4:
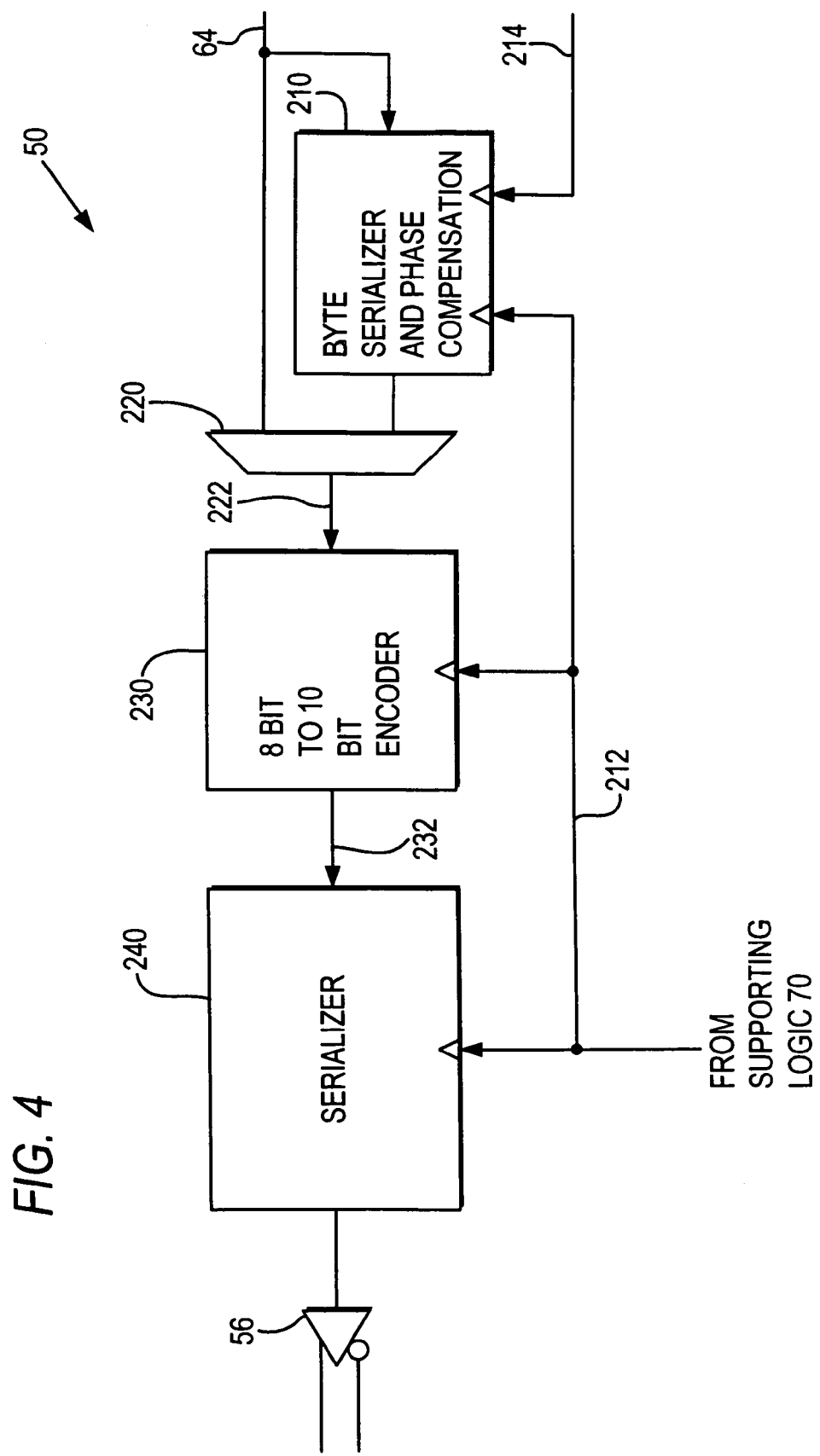
FIG. 4 is a more detailed, but still simplified schematic block diagram of another representative portion of the circuitry shown in FIG. 2.

FIG. 4 shows the transmitter portion of one representative channel 50 (FIG. 2) in somewhat more detail. Successive bytes (or byte pairs) output by PLD core 20 via leads 64 are applied to one set of the inputs of PLC 220, and also to byte serializer and phase compensation circuitry 210. In the case that PLC core outputs byte pairs in parallel (rather than one byte at a time), one of the functions of circuitry 180 is to serialize the bytes in such a pair into two serial bytes. Circuitry 210 is clocked by a clock signal on lead 212 that may come from supporting logic 70. Circuitry 210 may also be clocked by a PLD core clock signal on lead 214. Circuitry 210 may provide phase compensation between a possibly different phasing of the signals on leads 212 and 214 (similar to the above-described phase compensation function of circuitry 180). (As in the case of above-described network 114 (FIG. 3), various portions of network 212 may convey bit rate or byte rate versions of a clock signal. Elements 210 and 230 need only the byte rate version, but element 240 needs both the byte rate version and the bit rate version.) The output signals of circuitry 210 are applied to the other set of inputs of PLC 220.

PLC 220 is programmable or otherwise controllable to connect either set of its inputs to its outputs 222. Thus PLC 220 allows circuitry 210 to be either used or bypassed, as desired.

The 8-bit byte signals on leads 222 are applied to 8 bit to 10 but encoder circuitry 230. Encoder 230 converts each 8-bit byte to 10-bit form in accordance with the scheme shown in above-mentioned Franaszek et al. U.S. Pat. No. 4,486,739. Circuitry 230 is also clocked by signal 212.

The 10-bit parallel output signals of encoder 230 are applied to serializer circuitry 240. Serializer 240 converts the parallel data it receives to serial form for application to output driver 56. An illustrative construction for serializer 240 is shown in the above-mentioned Aung et al. reference, although any other suitable construction may be used instead if desired. Once again, serializer 240 is clocked by signal 212.

Figure 5A:
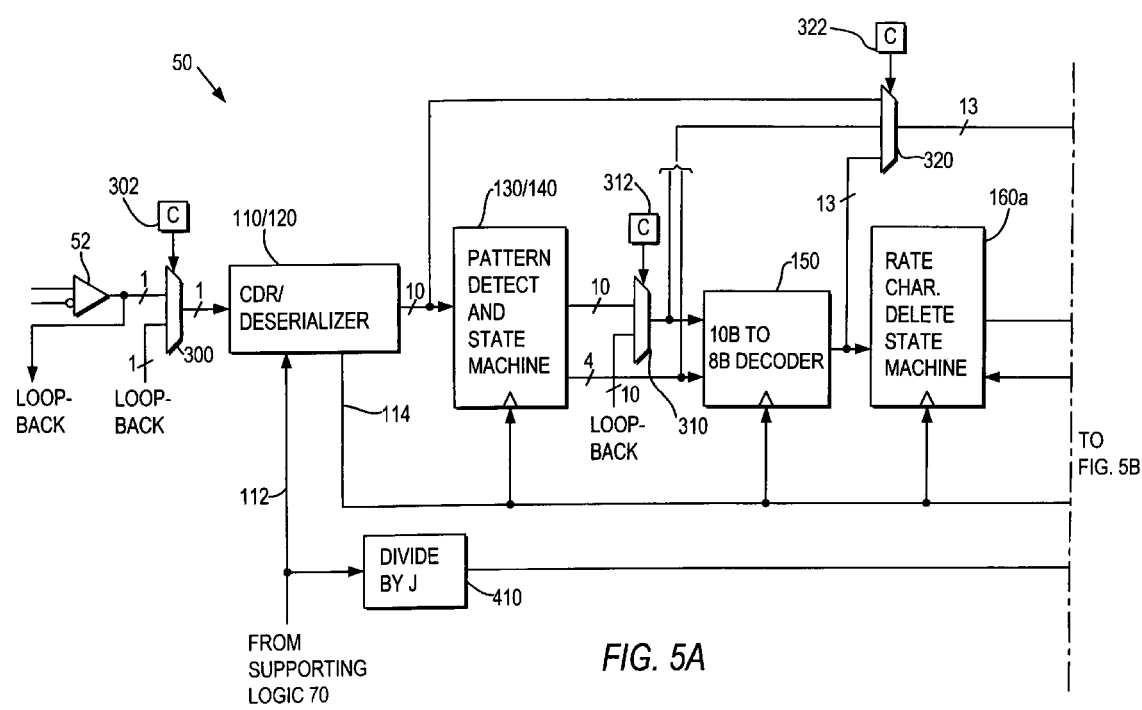
Figure 5B:
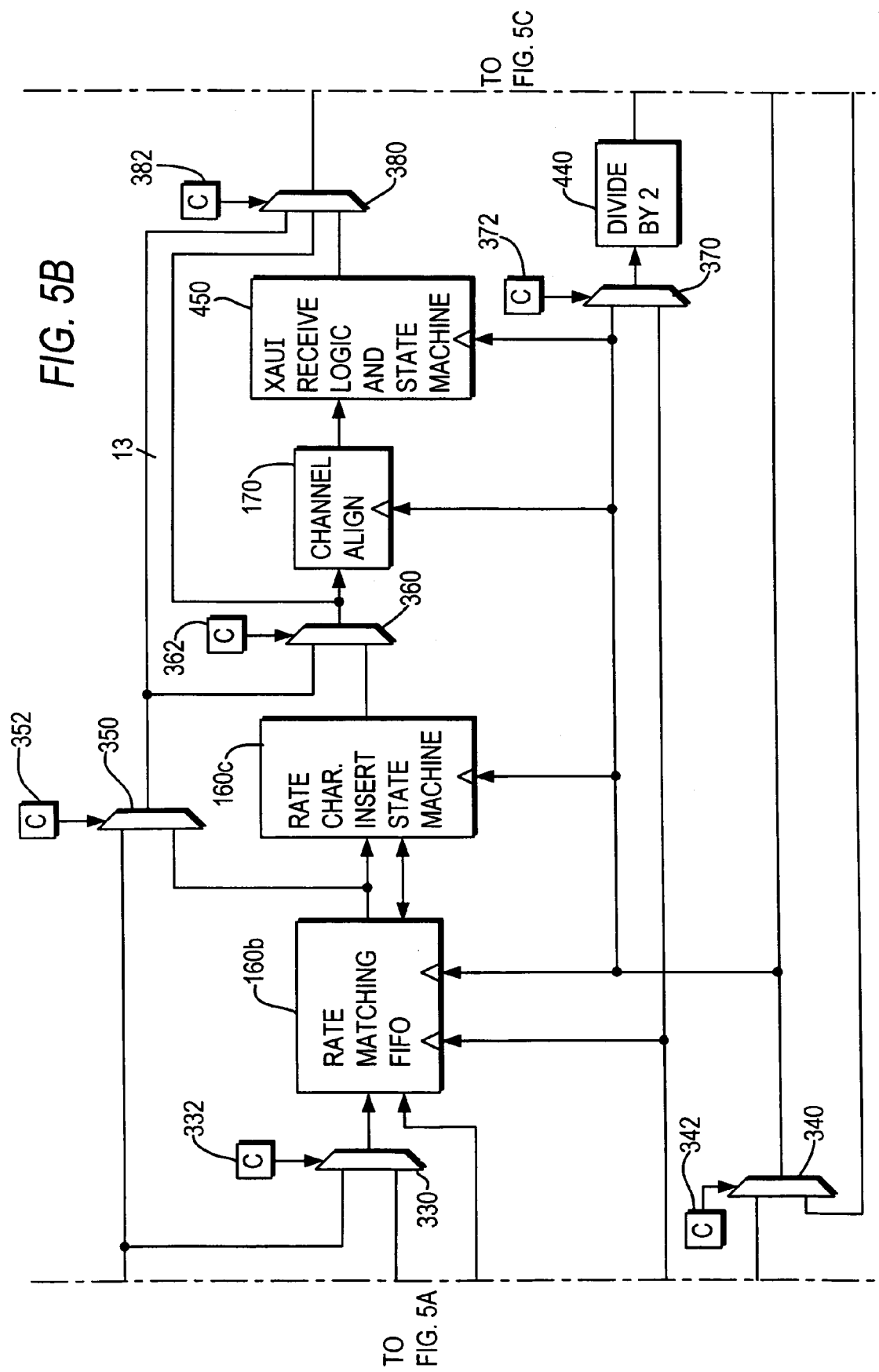

More possible features for circuitry of the type shown in FIG. 3 are shown in FIGS. 5A–5C. These FIGS. will now be described, but it will not be necessary to repeat description of elements that have already been described in connection with FIG. 3.

Figure 6:
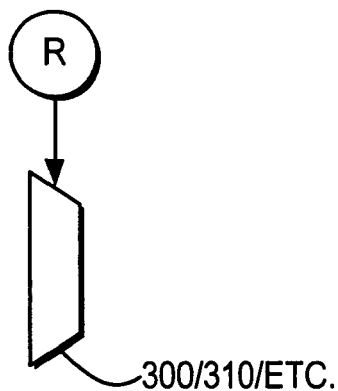
FIG. 6 shows in more detail an illustrative embodiment of a type of element that is used in several of the other FIGS.
Figure 7:
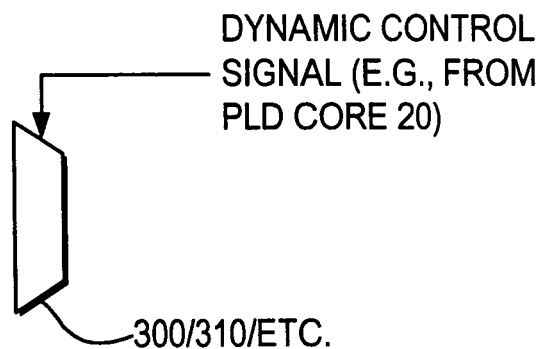
FIG. 7 shows an alternative embodiment of what is shown in FIG. 6.
Figure 8:
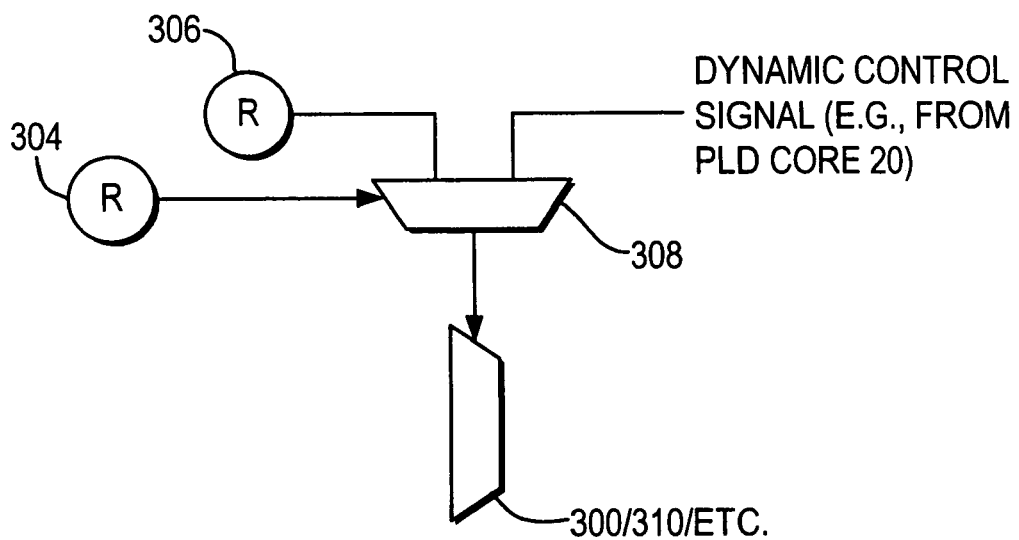
FIG. 8 shows another alternative embodiment of what is shown in FIGS. 6 and 7.

Among other things, FIGS. 5A–5C show the inclusion of controllable routing that allows various subsets of the elements shown in FIG. 3 to be used in various applications of the circuitry. Principal components involved in selecting a particular desired routing are PLCs like 300, 310, 320, etc. These PLCs are controlled by associated control circuitry like 302, 312, 322, etc. Such control circuitry 302, etc., can take any of several forms. For example, function control elements ("FCEs") (e.g., programmable memory cells) R can be used to control a PLC as shown in FIG. 6. This type of control is basically static and can be changed only by reprogramming the PLD (assuming the PLD is re-programmable). Another possible type of control is more dynamic control (e.g., based on a signal or signals from PLD core circuitry 20 that can change from time to time). FIG. 7 illustrates this type of control. Still another possible type of control is programmable selection between either of the two types of previously described control (see FIG. 8). In the particular example shown in FIG. 8, PLC 300/310/ETC. is controlled by the output signal of PLC 308. FCE 304 controls which of the two inputs to PLC 308 that PLC bases its output signal on. One of those two inputs comes from FCE 306 and is therefore a static signal. The other input to PLC 308 can be a more dynamic signal (e.g., from PLD core 20). Thus if static control of PLC 300/310/ETC. is desired, FCE 304 is programmed to cause PLC 308 to output the signal from FCE 306. On the other hand, if more dynamic control of PLC 300/310/ETC. is desired, FCE 304 is programmed to cause PLC 308 to output its dynamic input signal. Any of the types of control illustrated by FIGS. 6–8 can be used to control any of the PLCs shown herein.

One reason for adding to circuitry of the type shown in FIG. 3 various routing options as shown in FIGS. 5A–5C is the following. The circuitry shown in FIG. 3 has all the elements needed to support the XAUI standard. But all of the operations needed to support XAUI may not be needed to support other standards. If non-XAUI communication is being implemented, the routing options added in FIG. 5 allow the functions that are not needed to be bypassed. Alternatively, some standards or protocols may require functions that are generally like XAUI functions, but that are sufficiently different from standard XAUI functions that XAUI-specific circuitry is not suitable for performing them. In that case, general purpose PLD core circuitry 20 may be used to perform those functions, and the routing options added in FIG. 5 allow signals to be routed to the PLD core 20 when the transition from so-called "hard-logic" (in dedicated, largely hard-wired circuitry 50) to so-called "soft-logic" (in PLD core 20) is to be made.

FIGS. 5A–5C indicate illustrative widths for many of the depicted buses. It will be understood, however, that these bus widths are only exemplary, and that other bus widths can be used instead if desired. Also, the particular routing options shown in FIGS. 5A–5C are illustrative, and other routing options can be used instead or in addition if desired.

Figure 12A:
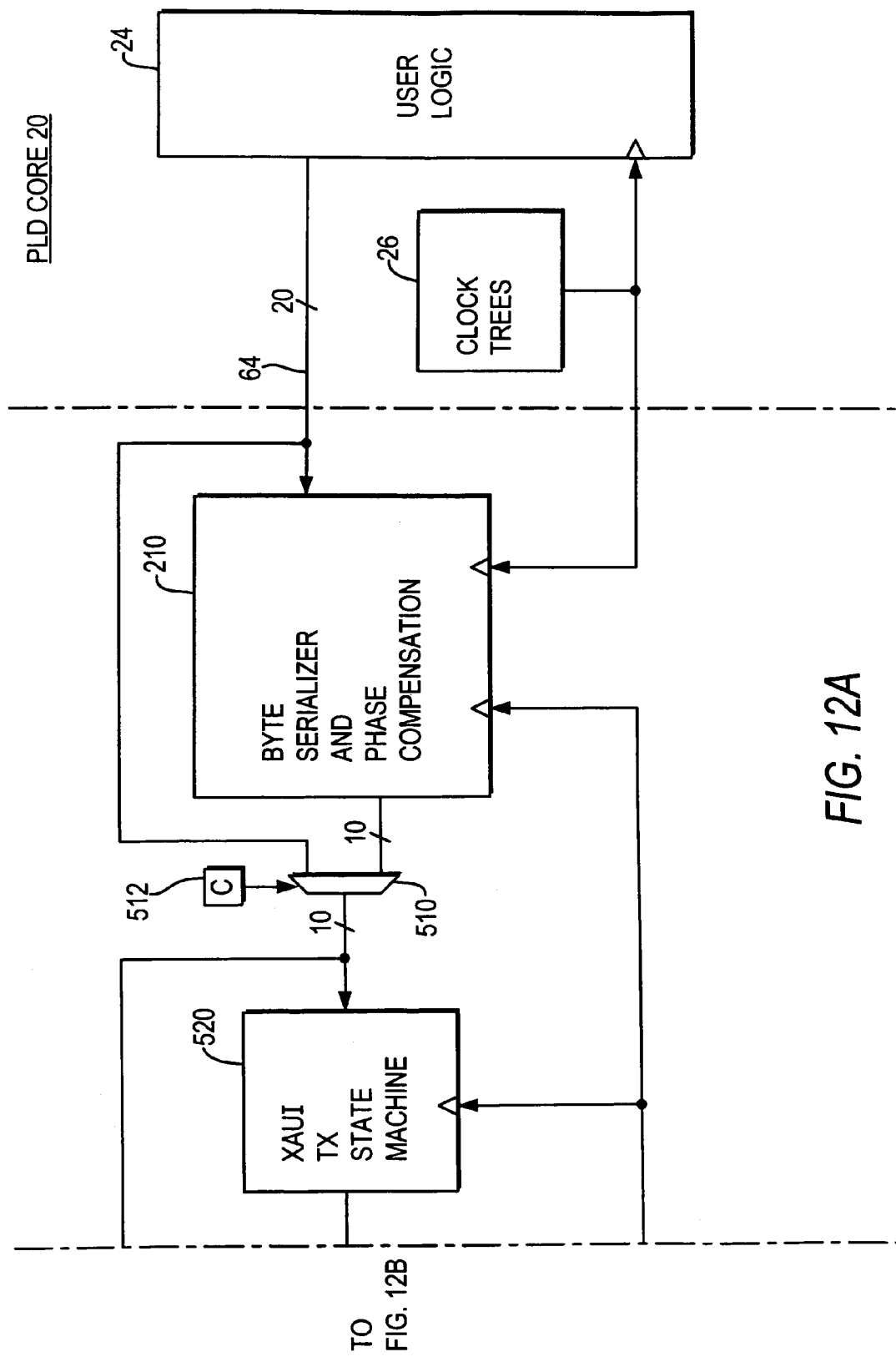
FIGS. 12A and 12B are collectively a more detailed, but still simplified schematic block diagram of circuitry of the type shown in FIG. 4.
Figure 12B:
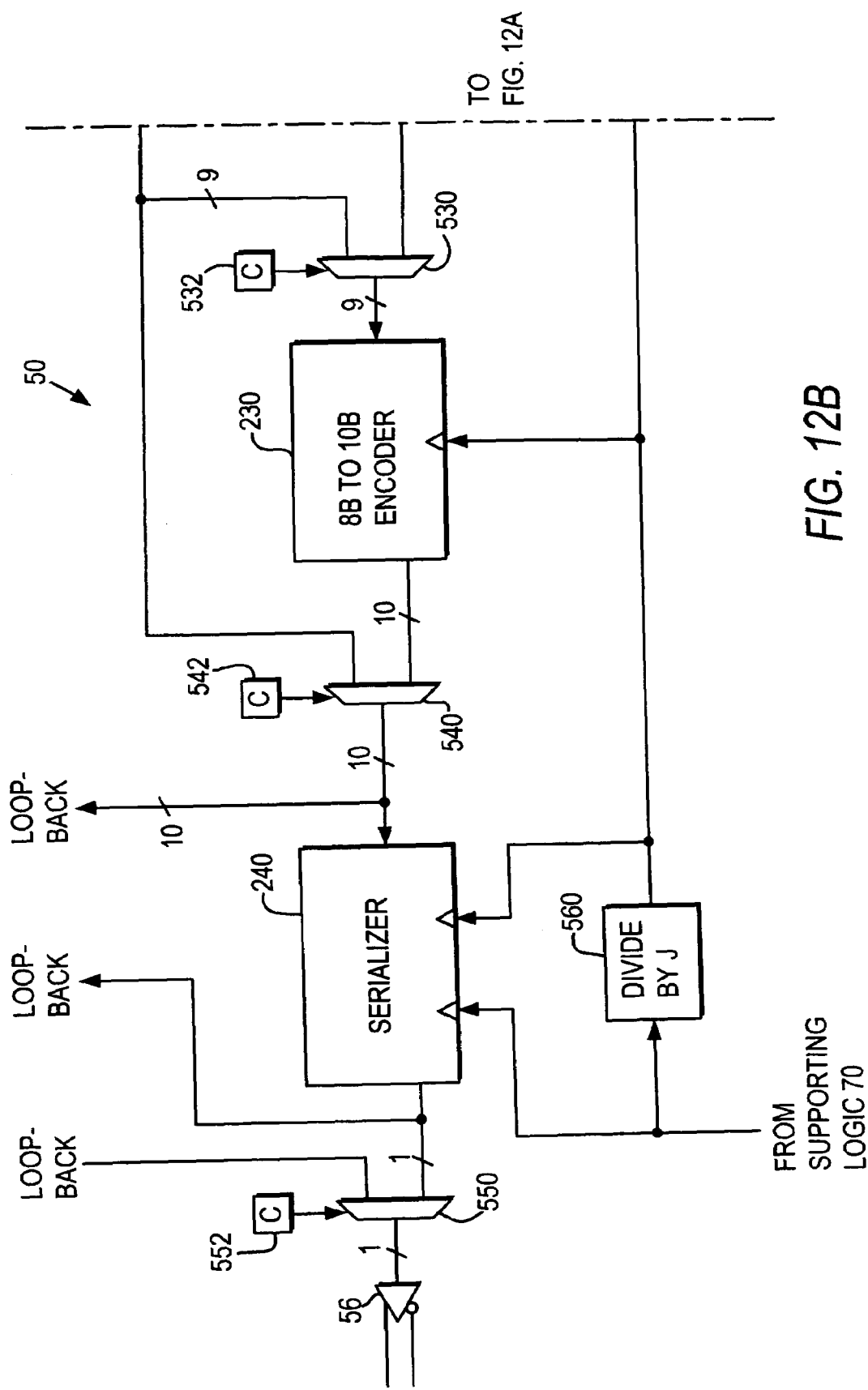

In FIG. 5A the circuitry essentially begins with a PLC 300 for selecting either the incoming CDR signal from driver 52 or a loop-back CDR signal from the associated transmitter circuitry (FIG. 4 or, in more detail, FIG. 12B). The loop-back option is primarily intended as a test mode. It allows the user to process a signal out through the transmitter circuitry and then back in again through the receiver circuitry to test whether that processing is improperly altering the signal. No external connection needs to be made. If the test signal comes back unaltered, then it is known that both the transmitter and receiver circuitries are operating properly. PLC 300 is an example of a PLC that it may be desirable to control dynamically (e.g., as in FIG. 7) so that PLC 300 can initially select the test or loop-back mode, and thereafter be switched to the more normal operating mode in which the PLC passes the output signal of driver 52.

Figure 9:
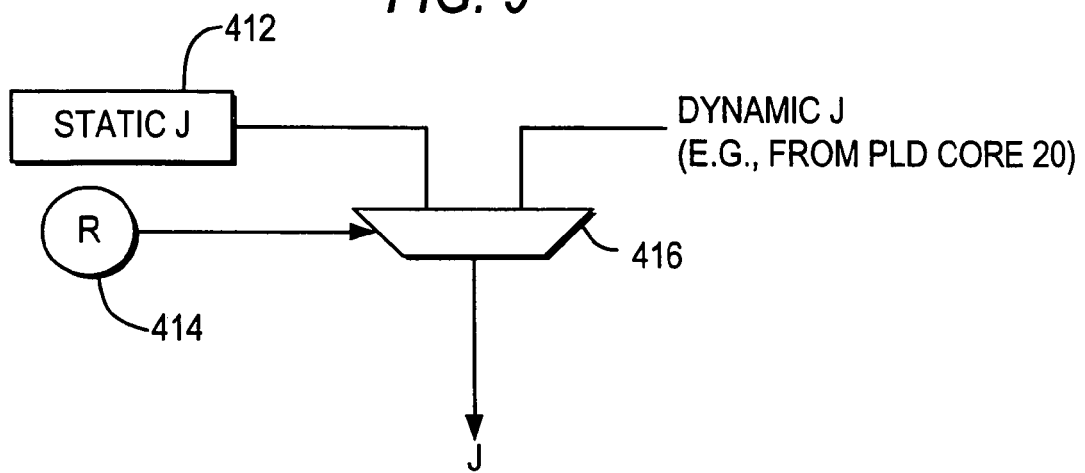
FIG. 9 is a simplified schematic block diagram of circuitry that can be used with the circuitry of FIGS. 5A–5C and/or FIGS. 12A and 12B.

The output signal of PLC 300 is applied to CDR/deserializer 110/120, already described in connection with FIG. 3. As was mentioned in that earlier discussion, circuitry 110/120 also receives several candidate recovered clock signals from supporting logic 70. One of those clock signals is applied to divide by J circuitry 410, which divides the frequency of the applied signal by a scale factor J. J can be the number of bits in each byte, so that whereas the input signal to circuit 410 has the frequency of the bit rate, the output signal of circuit 410 has the frequency of the byte rate. J can be a programmable (e.g., static) value. For example, the value of J may be programmed into FCEs associated with circuit 410. Alternatively, J may be a more dynamic signal (e.g., supplied by PLD core 20). FIG. 9 shows illustrative circuitry for allowing the value of J used by circuit 410 to be either a programmed static value (from programmable FCE register 412) or a dynamic value (e.g., from PLD core 20). PLC 416 is programmably controlled by FCE 414 to select either the static or dynamic input for use as the finally selected value of J. J is 10 for XAUI applications, but it may be a number less than 10 for certain non-XAUI applications. The output signal of circuit 410 may be needed by certain of the elements downstream in the receiver circuitry as will be described in more detail below.

To enable the circuitry to support certain non-XAUI standards or protocols, the deserializer portion 120 of circuitry 110/120 is preferably able to handle bytes of various lengths (i.e., 10 bits for XAUI, but less than 10 bits for certain non-XAUI standards). This was mentioned briefly in connection with FIG. 3, but it can be elaborated here by noting that this function is similar to the operation of above-described divide by J circuit 410. In particular, the same value of J (controlled or selected in the same way as for circuit 410) may be used within deserializer portion 120 to determine the byte length that the deserializer provides. The output bus width of circuitry 110/120 is shown as 10 in FIG. 5A (as is required for XAUI), but if J is less than 10 in some non-XAUI application, then only J of the 10 available output leads will actually be used in that application.

The deserialized (and therefore parallel) data outputs of circuitry 110/120 are applied to pattern detect and state machine circuitry 130/140 (described above in connection with FIG. 3), and also to one set of inputs of PLC 320. Jumping ahead briefly, it will be seen that one possible routing for these signals applied to PLC 320 is through PLC 380 (FIG. 5B) and through PLC 390 (FIG. 5C) to PLD core 20 (FIG. 5C). Thus, if after deserialization in circuitry 110/120, it is not desired to do any further hard-logic processing of the incoming data, that data can be sent directly to PLD core 20, where all further processing is in the soft-logic of the device. This is only one of several possible routings of the signals applied to PLC 320 from circuitry 110/120, and other possible routings will be discussed below.

Figure 10:
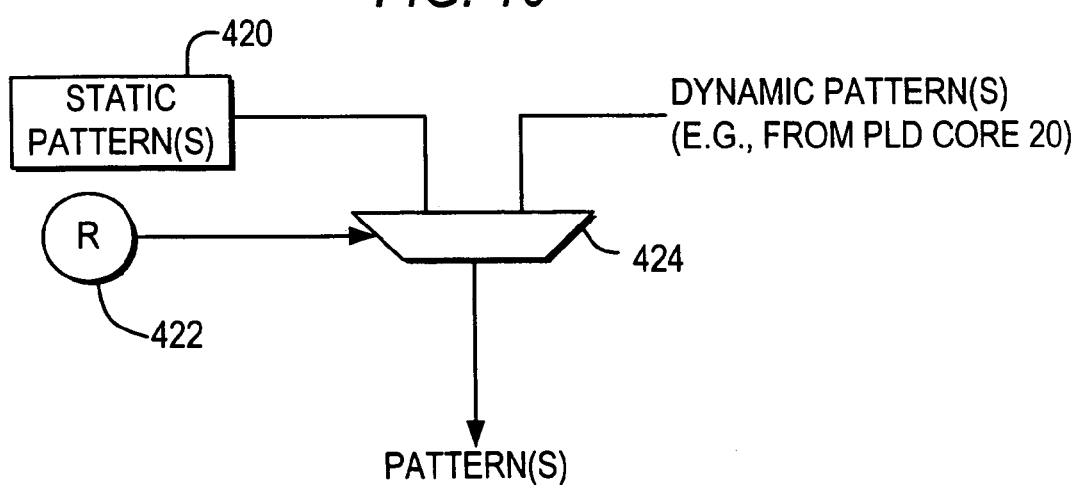
FIG. 10 is a simplified schematic block diagram of circuitry that can be used with the circuitry of FIGS. 5A–5C.

Returning to circuitry 130/140 in FIG. 5A, the patterns (special characters) that this circuitry detects may be selectable to help the circuitry support various standards or protocols. For example, FIG. 10 shows illustrative circuitry that allows the pattern(s) used by circuitry 130/140 to be either static pattern(s) programmed into FCE registers 420 or dynamic pattern(s) (e.g., from PLD core 20). PLC 424 is controlled by FCE 422 to select either the static or dynamic pattern inputs for use as the final pattern(s) that circuitry 130/140 will detect. By providing multiple instances of circuitry of the type shown in FIG. 10, some patterns can be made static, while other patterns are made dynamic.

Figure 11:
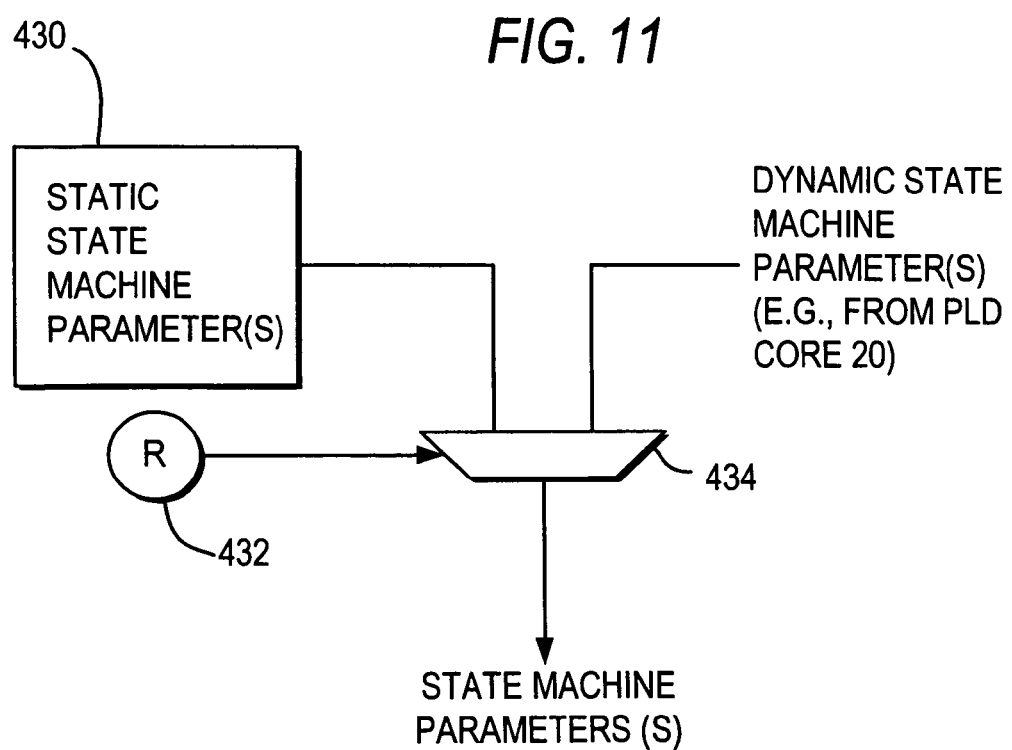
FIG. 11 is a simplified schematic block diagram of circuitry that can be used with the circuitry of FIGS. 5A–5C and/or FIGS. 12A and 12B.

Various parameters employed by the state machine portion 140 of circuitry 130/140 may also be controllable or selectable to help the circuitry support various standards or protocols. FIG. 11 shows illustrative circuitry for allowing such state machine parameters to be either static or dynamic. As shown in FIG. 11, FCE registers 430 can be programmed with one or more parameter values for the state machine portion 140 of circuitry 130/140. Because they are programmed into the device, these values are "static". PLC 434 is programmably controlled by FCE 432 to select either the static values or values that can be more dynamic (e.g., from PLD core 20). It will be appreciated that, by providing multiple circuits like that shown in FIG. 11, some parameter values can be made static, while others are made dynamic.

The output signals of circuitry 130/140 are shown in FIG. 5A to include up to 10 data signals and up to 4 other signals. These 4 other signals may include flag signals to indicate that particular patterns have been detected by circuitry 130/140.

The data output signals of circuitry 130/140 are applied to one set of inputs of PLC 310. Loop-back signals (from the associated transmitter circuitry (FIG. 4 or, in more detail, FIG. 12B)) are applied to the other set of inputs of PLC 310. This loop-back routing may be used like earlier-described loop-back routing (e.g., to facilitate testing of portions of the circuitry). PLC 310 is controllable by control circuitry 312 to pass the data on either set of its inputs to its outputs.

The outputs of PLC 310 and the 4 outputs of circuitry 130/140 that are not applied to PLC 310 are applied to 10B to 8B decoder 150, and also to one set of inputs of PLC 320. Decoder 150 has already been described in connection with FIG. 3 and does not need to be described again here. The routing to and through PLC 320 allows decoder 150 to be bypassed if desired. The bypass routing can be used for implementing a communication standard or protocol that does not require 10B to 8B decoding.

The output signals of decoder 150 are applied to rate character delete state machine 160*a,* and also to another set of inputs of PLC 320. The output signals of circuitry 150 include up to 8 parallel data signals and up to 5 parallel flag signals, for a total of up to 13 parallel signals. Although not shown in FIG. 3 as a separate part of circuitry 160, the function of circuitry 160*a* is mentioned in the earlier discussion of FIG. 3. To briefly recapitulate, as part of the rate matching function of circuitry 160, it may be necessary to occasionally delete a character (byte) that has been received. This can be safely done for at least many of the characters that are transmitted during idle intervals. State machine 160*a* therefore typically performs its character-deleting function when signals from upstream circuitry such as 130/140/150 indicate that non-essential idle interval data is being received, and when downstream circuitry such as rate matching FIFO 160*b* indicates that the downstream circuitry is approaching the limit of its capacity to buffer the rate difference that is being experienced. Character deletion can be implemented by causing rate matching FIFO circuitry 160*b* (FIG. 5B) to skip one byte in its reading operation in response to an appropriate signal from state machine 160*a*. If desired, one or more of the parameters employed in state machine 160*a* may be made programmably selectable or dynamically changeable in the same way that can be done for the state machine portion 140 of circuitry 130/140 (e.g., by supplying parameter values from circuitry of the type shown in FIG. 11).

The data output signals of state machine 160*a* are applied to one set of inputs of PLC 330 (FIG. 5B). State machine 160*a* also exchanges control signals with rate matching FIFO circuitry 160*b* via routing that does not pass through PLC 330. The other set of inputs to PLC 330 comes from the outputs of PLC 320. Circuitry 332 controls PLC 330 to apply either of its sets of inputs to circuitry 160*b*. PLC 330 thus allows circuitry 160*b* to receive its data inputs from state machine 160*a*. Alternatively, PLCs 320 and 330 allow circuitry 160*b* to receive its data inputs directly from (a) the outputs of decoder 150, (b) the outputs of PLC 310, or (c) the outputs of CDR/deserializer circuitry 110/120. Thus rate matching FIFO circuitry 160*b* can be used either with or without rate character deletion 160*a,* with or without 10B to 8B decoding 150, and with or without pattern detection 130/140.

The rate matching operation of circuitry 160*b* has been described earlier in connection with FIG. 3 and does not need to be described again here. It should be mentioned here, however, that PLC 340 (controlled by control circuitry 342) allows the second clock input signal to circuitry 160*b* to be either the output signal of divider circuit 410 (FIG. 5A) or a PLD core clock signal (i.e., from the conventional clock signal distribution network ("clock trees") 26 (FIG. 5C) of PLD core 20). The output signal of PLC 340 is also the clock signal applied to several other elements downstream from circuitry 160*b*.

The data output signals of circuitry 160*b* are applied to rate character insert state machine 160*c,* and also to one set of inputs of PLC 350. Circuitry 160*b* also exchanges control signals with circuitry 160*c*. The other set of inputs to PLC 350 are the outputs of PLC 320.

Although not shown separately in FIG. 3, the function of rate character insert state machine 160*c* has already been described in general terms in connection with FIG. 3. Character (i.e., byte) insertion is conceptually like character deletion, except that insertion is performed in response to a rate difference that is of polarity opposite to a rate difference that will necessitate character deletion. Character insertion can be done at times like those at which it would be appropriate to do character deletion. Character insertion can be implemented by having output signals of state machine 160*c* cause circuitry 160*b* to read the same byte twice. As in the case of other state machines that have already been described, one or more of the operating parameters of state machine 160*c* can be made programmable or dynamically variable (e.g., by supplying them from or via circuitry of the type shown in FIG. 11). The alternative output routing of circuitry 160*b* via PLC 350 allows circuitry 160*c* to be bypassed if the rate character insertion function is not needed in implementing a particular communication protocol or standard.

The data output signals of circuitry 160*c* are applied to one set of inputs of PLC 360. The outputs of PLC 350 are applied to the other set of inputs of PLC 360, and also to one set of the inputs of PLC 380. Control circuitry 362 causes PLC 360 to output the signals from either of its two sets of inputs. The output signals of PLC 360 are applied to channel align circuitry 170, and also to a second set of inputs to PLC 380.

The functions of element 170 have already been described in connection with FIG. 3 and do not need to be described again here. As in the case of earlier-described state machines, one or more of the parameters controlling some or all of the operations of the state machine in or associated with circuitry 170 may be programmable or dynamically variable (e.g., by using one or more instances of circuitry of the type shown in FIG. 11).

The output signals of channel align circuitry 170 are applied to XAUI receive logic and state machine 450. The XAUI standard specifies that XAUI data must conform to certain rules, and circuitry 450 performs conventional functions related to those rules. Once again, the state machine portion of circuitry 450 may have parameters controlled as shown in FIG. 11.

The output signals of circuitry 450 are applied to a third set of inputs of PLC 380. Control circuitry 382 controls PLC 380 to output any one of its three sets of inputs. Thus PLC 380 can output either (a) the outputs of PLC 350, (b) the outputs of PLC 360, or (c) the outputs of circuitry 170*b*.

As shown in FIG. 5C, the outputs of PLC 380 are applied to byte serializer and phase compensation circuitry 180, and also to one set of inputs of PLC 390. (PLC 390 in FIG. 5C is the same as PLC 190 in FIG. 3.) Circuitry 180 has already been described in connection with FIG. 3 and therefore does not need to be described again. However, it should be mentioned that FIG. 5B shows divide by 2 circuit 440 that divides an applied clock signal by 2 for use by circuitry 180 in cutting the byte rate in half (needed for byte deserialization). (Elements 370 and 372 allow the signal applied to circuit 440 to be either recovered clock signal 114 or the output signal of PLC 340.) The two-byte-wide data outputs of circuitry 180 are applied to a second set of inputs of PLC 390. Circuitry 392 controls PLC 390 to apply either of its sets of inputs to PLD core 20 (especially the user logic 24 of the PLD core). PLC 390 therefore allows PLD core 20 to receive either (a) the outputs of circuitry 180, or (b) the outputs of PLC 380 (if the functions of circuitry 180 are not needed to support a particular communication protocol).

In general, the various clock signal selection and routing options provided in FIGS. 5A–5C (e.g., by PLCs 340 and 370) complement the various data routing options.

From the foregoing, it will be seen that many different subcombinations of the operating circuitry shown in FIGS. 5A–5C can be used to support many different communication protocols or standards. The following table lists just some of the possibilities (using in each case the reference number(s) of the operating portions that are used in the subcombination and omitting the reference number(s) of the operating portions that are not used).

| Option | Operating Portions Used |
| --- | --- |
| 1. | 110/120 |
| 2. | 110/120, 180 |
| 3. | 110/120, 160b |
| 4. | 110/120, 160b, 180 |
| 5. | 110/120, 170a, 170b |
| 6. | 110/120, 170a, 170b, 180 |
| 7. | 110/120, 160b, 170a, 170b |
| 8. | 110/120, 160b, 170a, 170b, 180 |
| 9. | 110/120, 130/140 |
| 10. | 110/120, 130/140, 180 |
| 11. | 110/120, 130/140, 150 |
| 12. | 110/120, 130/140, 150, 180 |
| 13. | 110/120, 130/140, 150, 160a–c |
| 14. | 110/120, 130/140, 150, 160a–c, 180 |
| etc. | Other combinations are also possible. |

Additional elements of variability that facilitate implementing many different communication protocols or standards result from the following: (1) the ability to programmably select or dynamically vary many of the operating parameters of the operating portions of the circuitry, and (2) the ability to use PLD core 20 to perform (soft-logic) variants of operations of the various kinds associated with the hard-logic operating portions. Example of immediately preceding item (1) have been discussed in connection with FIGS. 6–11. An example of immediately preceding item (2) would be performing in PLD core 20 a type of 10B to 8B decoding different from that performable by hard-logic operating circuitry 150.

FIGS. 12A and 12B show illustrative transmitter circuitry 50 that can be associated with the receiver circuitry of FIGS. 5A–5C. The circuitry shown in FIGS. 12A and 12B is like that shown in FIG. 4, but is augmented with additional capabilities to give it more flexibility and thereby enable it to support various different communication protocols or standards. Many of the elements shown in FIGS. 12A and 12B are repeated from FIG. 4. Because those elements have already been described in connection with FIG. 4, it will not be necessary to fully describe them again in connection with FIGS. 12A and 12B. As in the case of FIGS. 5A–5C, the bus widths shown in FIGS. 12A and 12B are only illustrative, and other bus widths can be used instead if desired.

As shown in FIG. 12A, data signals output by user logic 24 in PLD core 20 are applied to byte serializer and phase compensation circuit 210 (previously described in connection with FIG. 4). These signals are also applied to one set of inputs of PLC 510 (the same as PLC 220 in FIG. 4). The outputs of circuitry 210 are applied to the other set of inputs of PLC 510. Control circuitry 512 controls PLC 510 to select either of its sets of inputs as its outputs. As was mentioned in connection with FIG. 4, PLC 510 allows signals to be routed around circuitry 210 if the communication protocol being implemented does not require use of circuitry 210.

The output signals of PLC 510 are applied to XAUI transmitter state machine circuitry 520, and also to one set of the inputs of each of PLCs 530 and 540. Like circuitry 450 in FIG. 5B, circuitry 520 performs conventional functions related to XAUI's rules for XAUI data. Circuitry like that shown in FIG. 11 can again be used to control parameters used by circuitry 520.

The output signals of state machine 520 are applied to the second set of inputs of PLC 530. Control circuitry 532 controls PLC 530 to select either of its sets of inputs as its outputs. PLC 530 (and also PLC 540, described later) allows circuitry 520 to be bypassed if the communication protocol being implemented does not require use of circuitry 520.

The output signals of PLC 530 are applied to 8B to 10B encoder 230 (described earlier in connection with FIG. 4). The output signals of encoder 230 are applied to the other set of inputs of PLC 540. Control circuitry 542 controls PLC 540 to select either of its inputs as its outputs. PLC 540 therefore allows both of elements 520 and 230 to be bypassed if the communication protocol being implemented does not require use of those elements.

The output signals of PLC 540 are applied to serializer circuitry 240 (described earlier in connection with FIG. 4). The output signals of PLC 540 are also the loop-back signals applied to the second set of inputs of PLC 310 (FIG. 5A) in the associated receiver circuitry. Divide by J circuitry 560 supports operation of other elements in FIGS. 12A and 12B by dividing by J a bit rate clock signal frequency from supporting logic 70 to produce a byte rate clock signal. As in earlier discussions herein, J is the number of bits (e.g., 10) in each byte in the communication protocol being implemented. The value of J used by circuitry 560 may be programmable or dynamically selectable (e.g., using circuitry like that shown in FIG. 9).

The serialized output of serializer 240 is applied to one input of PLC 550. The output of serializer 240 is also the loop-back input to PLC 300 in FIG. 5A. The other input to PLC 550 is the loop-back connection from the output of driver 52 (FIG. 5A). Control circuitry 552 controls PLC 550 to select either of its inputs for application to output driver 56. Accordingly, the last-mentioned loop-back connection allows testing of an input/output driver pair 52/56.

From the foregoing discussion of FIGS. 12A and 12B it will be seen that (like the receiver circuitry shown in FIGS. 5A–5C) this transmitter circuitry is capable of supporting many different communication protocols. The various routing options provided by PLCs 510, 530, 540, and 550 allow various ones of the operating components to be either used or bypassed as desired. Control of these PLCs may take any of the forms described earlier for other PLCs (e.g., any of the PLC control circuitry options shown in FIGS. 6–8 may be used). Also (similar to what is described earlier for FIGS. 5A–5C) various aspects of the operations of the operating components may be programmably selected or dynamically variable. For example, circuitry like that shown in FIG. 9 may be used to supply the value of J to circuit 560, and circuitry like that shown in FIG. 11 may be used to provide the values of various state machine parameters to circuitry 520. User logic 24 in PLD core 20 may be used to provide functions generally like those of bypassed operating components in FIGS. 12A and 12B in the event that the communication protocol being implemented requires deviation in function greater than the range of deviation that the bypassed operating component is capable of.

The circuitry shown and described herein has many features that facilitate its use to support a wide range of HSS communication standards and protocols. As has been described, the circuitry has four-channel building blocks (or quads) for HSS communication. The XAUI standard uses one quad. The InfiniBand standard may use either one channel, four channels, or 12 channels, and can therefore be supported by using one channel, one quad, or three quads. Each channel includes both a receiver and a transmitter that are capable of full duplex operation. The receiver and transmitter in a channel can operate at the same or different frequencies. For example, the frequency difference can be 2:1 or 4:1. The circuitry supports CDR signalling over a wide range of frequencies (e.g., a range from about 622 Mbps to about 3.2 Gbps). The CDR circuitry preferably includes loss of lock ("LOL") and run length violation ("RLV") protection (see, for example, the above-mentioned Aung et al. reference for illustrative LOL and RLV elements). A single PLL circuit (with LOL logic) can support an entire quad.

Still other advantageous features of the circuitry are the programmable serializer and deserializer elements. For example, these elements can be programmed to operate with either 10 bit words (bytes) or 8 bit words (bytes) by appropriately programming or otherwise controlling the parameter J. Similarly, the width of the bus (excluding status/control signals) between a channel and the PLD core 20 is programmable (e.g., to 8, 10, 16, or 20). The character recognition and alignment logic is preferably programmable (e.g., with respect to the characters to be recognized and/or with respect to the state machine functions used in the recognition and/or alignment). 8B/10B encoder and decoder circuits meeting industry standards (e.g., the IEEE 802.3 z standard) are preferably included.

The circuitry preferably includes programmable (or otherwise controllable) power-down for each transmitter and receiver so that each transmitter and receiver can be turned off if it is not needed. Separate reset control is preferably also provided for each transmitter and receiver.

Figure 13:
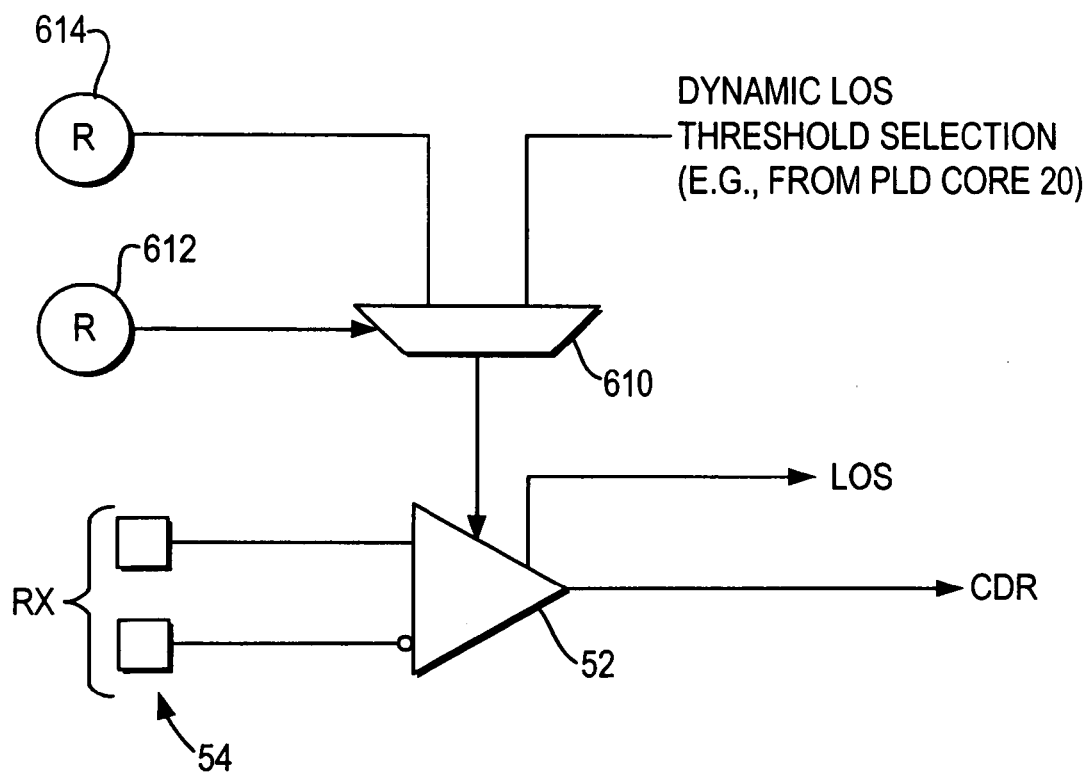
FIG. 13 is a simplified schematic block diagram of additional circuitry in accordance with the invention.

Because different differential signalling standards or protocols may use voltage swings of different magnitudes, the receiver drivers 52 used in the circuitry of this invention may be programmable or otherwise controllable to detect any of several different minimum amounts of applied voltage difference as a loss of signal ("LOS") condition. FIG. 13, for example, shows that each receiver driver 52 can include an LOS output for outputting an LOS signal when the difference between the RX input voltages is less than a minimum selected by the output(s) of PLC 610. This PLC is controlled by FCE 612 to select its outputs from either FCEs 614 or from a source of more dynamic signals such as PLD core 20. The various possible outputs of PLC 610 indicate to driver 52 which of several possible minimum RX signal voltage differences to detect as an LOS condition. If the voltage difference between the RX input signals falls below the indicated minimum, driver 52 produces an LOS signal to indicate that a valid differential input signal is not present.

Figure 14:
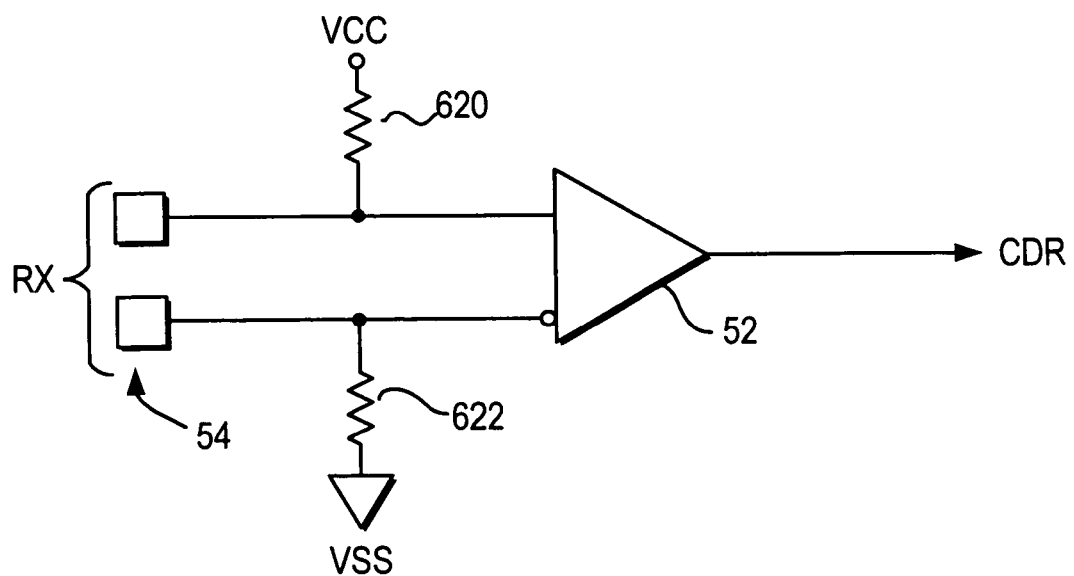
FIG. 14 is a simplified schematic block diagram of more additional circuitry in accordance with the invention.

Another feature that the circuitry of this invention may have is illustrated by FIG. 14. As shown in that FIG., each input lead to representative receiver driver 52 includes a weak pull up 620 to VCC (logic 1) or a weak pull down 622 to VSS (logic 0). These weak pull-up/pull-down connections help to prevent driver 52 from switching randomly and unnecessarily when the driver is not being used for a meaningful signal. This saves the power that would otherwise be consumed by such unnecessary switching of driver 52.

Figure 15:
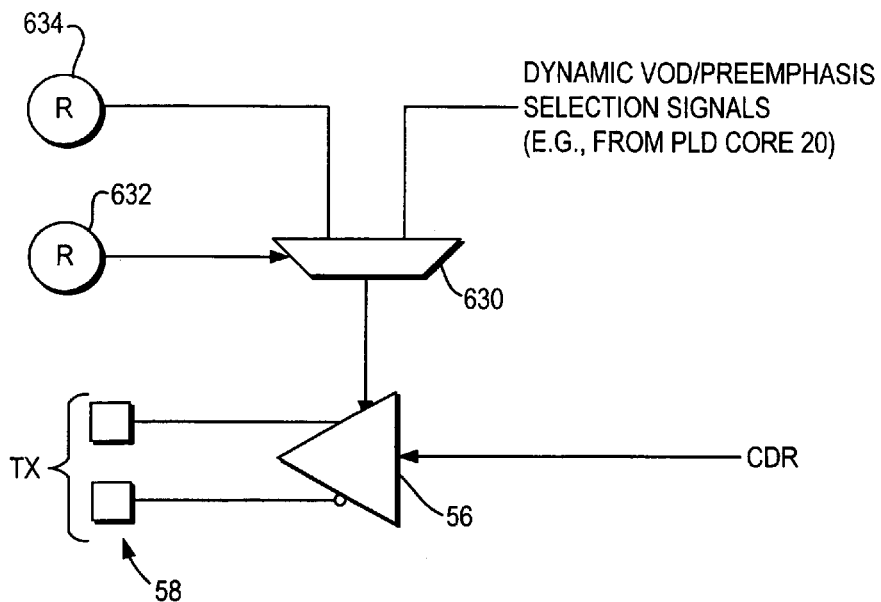
FIG. 15 is a simplified schematic block diagram of still more additional circuitry in accordance with the invention.

A feature that the transmitter circuitry of this invention may have is illustrated by FIG. 15. This feature is programmable or otherwise selectable output voltage offset or swing ("VOD"), which can be additionally accompanied by pre-emphasis, if desired. As shown in FIG. 15, representative output driver 56 receives one or more control signals from PLC 630. This PLC is controlled by FCE 632 to select these control signals from either FCEs 634 or from a source of more dynamic signals such as PLD core 20. The control signals thus applied to driver 56 cause it to operate with any one of two or more TX output signal voltage differences. These control signals may also cause driver 56 to operate with a desired amount of initial voltage difference pre-emphasis, if that is desired.

Figure 16:
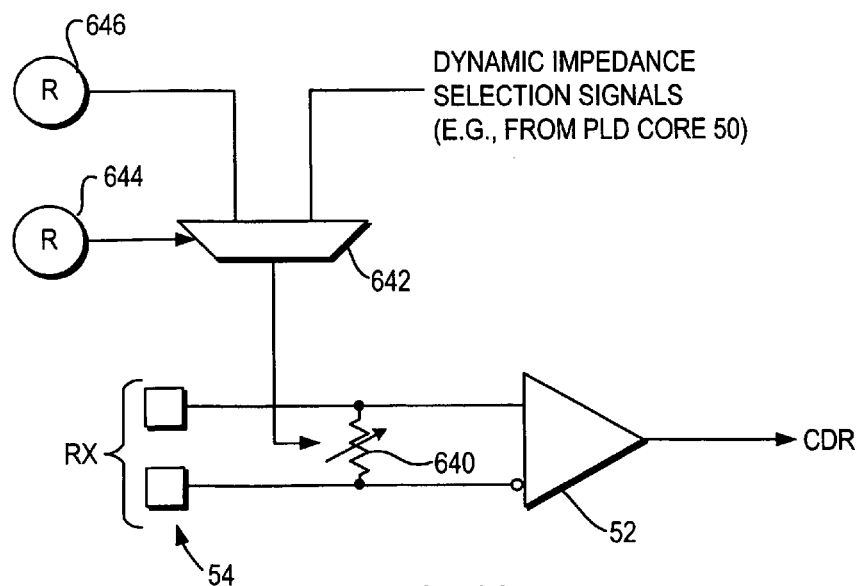
FIG. 16 is a simplified schematic block diagram of still further circuitry in accordance with the invention.

Still another feature that the circuitry of this invention may have is variable input impedance to better match the impedance of the transmission line from which the circuitry is receiving an input. As shown in FIG. 16, such variable input impedance is represented by variable resistor 640. The impedance of variable resistor 640 is controlled by one or more output signals from PLC 642. This PLC is controlled by FCE 644 to output either the output(s) of FCE(s) 646 or more dynamic impedance selection signals (e.g., from PLD core 20).

The circuitry of this invention may also allow the use of an external resistor for calibration. And the circuitry of the invention may include hot insertion/removal protection logic.

Figure 17:
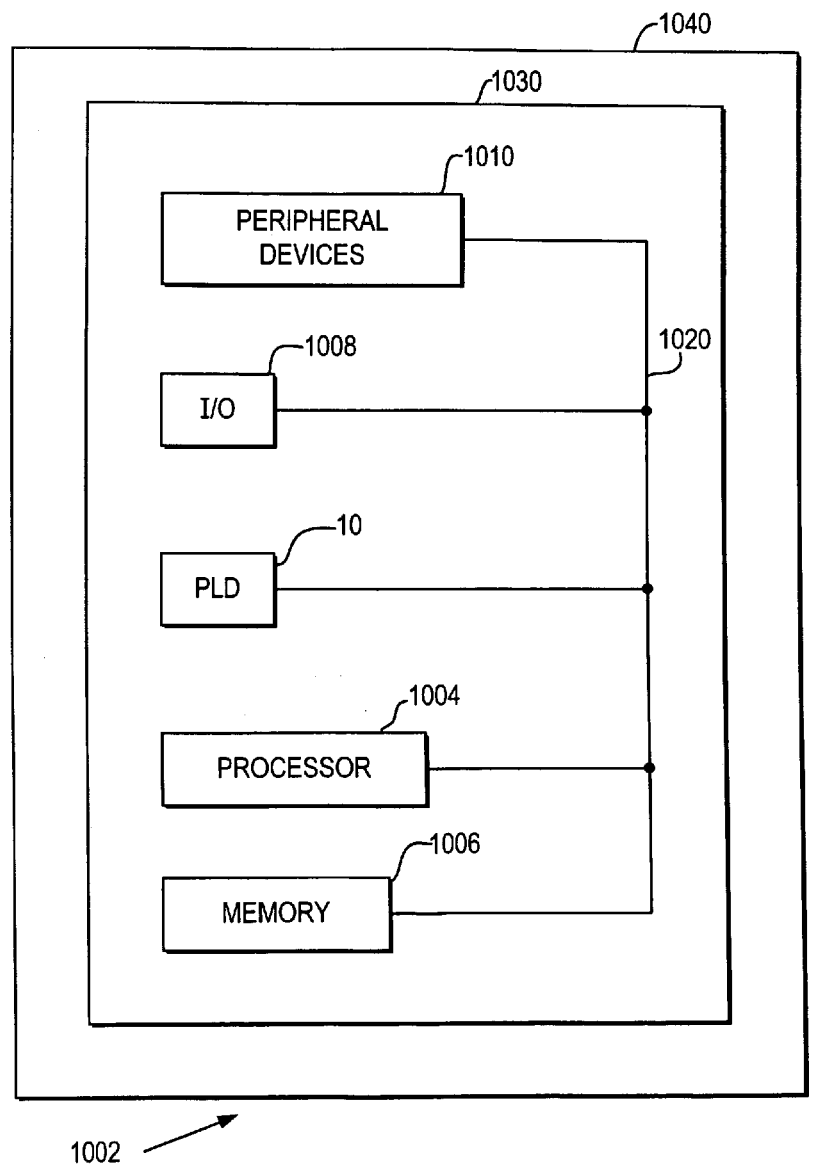
FIG. 17 is a simplified block diagram of an illustrative system employing circuitry in accordance with the invention.

FIG. 17 illustrates a PLD 10 of this invention in a data processing system 1002. Data processing system 1002 may include one or more of the following components: a processor 1004; memory 1006; I/O circuitry 1008; and peripheral devices 1010. These components are coupled together by a system bus or other interconnections 1020 and are populated on a circuit board 1030 that is contained in an end-user system 1040. Any of the interconnections between PLD 10 and any other elements may be made using the above-described CDR or LVDS signaling.

System 1002 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 1004. PLD 10 may also be used as an arbiter for arbitrating access to a shared resource in system 1002. In yet another example, PLD 10 can be configured as an interface between processor 1004 and one of the other components in system 1002. It should be noted that system 1002 is only exemplary, and that the true scope and spirit of the invention should be indicated by the following claims.

Various technologies can be used to implement PLDs having the features of this invention, as well as the various components of those devices (e.g., the above-described PLCs and programmable function control elements ("FCEs") that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. PLCs and other circuit components can be controlled by various, programmable, function control elements ("FCEs"). (With certain implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art, without departing from the scope and spirit of the invention. For example, the order of the various operating components shown and described above is, at least in some respects, only illustrative. Thus the order of at least some of these elements can be changed from the order shown, if that is desired.

The invention claimed is:

1. A programmable logic integrated circuit device comprising:
    programmable logic circuitry; and
    high speed serial interface circuitry including a plurality of functional subcircuits, each of which is at least partly hard-wired to perform a respective function that may be needed to provide a high speed serial interface, and programmably controllable routing circuitry adapted to allow at least one of the functional subcircuits to be selectively bypassed, the at least one of the functional subcircuits being selected from the group consisting of pattern detection circuitry, 10 bit to 8 bit decoder circuitry, 8 bit to 10 bit encoder circuitry, and channel alignment circuitry.

2. The device defined in claim 1 wherein the high speed serial interface circuitry comprises:
    receiver circuitry.

3. The device defined in claim 1 wherein the high speed serial interface circuitry comprises:
    transmitter circuitry.

4. The device defined in claim 1 wherein the functional subcircuits comprise:
    clock data recovery circuitry.

5. The device defined in claim 1 wherein the functional subcircuits comprise:
    deserializer circuitry.

6. The device defined in claim 1 wherein the at least one of the functional subcircuits comprises:
    pattern detection circuitry.

7. The device defined in claim 1 wherein the functional subcircuits comprise state machine circuitry, and wherein the programmably controllable routing circuitry is additionally adapted to allow the state machine circuitry to be selectively bypassed.

8. The device defined in claim 1 wherein the at least one of the functional subcircuits comprises:
    10 bit to 8 bit decoder circuitry.

9. The device defined in claim 1 wherein the functional subcircuits comprise rate matching circuitry, and wherein the programmably controllable routing circuitry is additionally adapted to allow the rate matching circuitry to be selectively bypassed.

10. The device defined in claim 1 wherein the at least one of the functional subcircuits comprises:
    channel alignment circuitry.

11. The device defined in claim 1 wherein the functional subcircuits comprise byte deserializer circuitry, and wherein the programmably controllable routing circuitry is additionally adapted to allow the byte deserializer circuitry to be selectively bypassed.

12. The device defined in claim 1 wherein the functional subcircuits comprise byte serializer circuitry, and wherein the programmably controllable routing circuitry is additionally adapted to allow the byte serializer circuitry to be selectively bypassed.

13. The device defined in claim 1 wherein the at least one of the functional subcircuits comprises:
    8 bit to 10 bit encoder circuitry.

14. The device defined in claim 1 wherein the functional subcircuits comprise:
    serializer circuitry.

15. The device defined in claim 1 wherein the functional subcircuits comprise character deletion circuitry, and wherein the programmably controllable routing circuitry is additionally adapted to allow the character deletion circuitry to be selectively bypassed.

16. The device defined in claim 1 wherein the functional subcircuits comprise character insertion circuitry, and wherein the programmably controllable routing circuitry is additionally adapted to allow the character insertion circuitry to be selectively bypassed.

17. The device defined in claim 1 wherein the at least one functional subcircuit is at least partly programmably controllable to vary a function performed by that functional subcircuit.

18. The device defined in claim 1 wherein routing selectable by the routing circuitry includes applying a signal that is bypassing one of the functional subcircuits to another of the functional subcircuits.

19. The device defined in claim 1 wherein routing selectable by the routing circuitry includes applying a signal that is bypassing a functional subcircuit to the programmable logic circuitry.

20. A digital processing system comprising:
    processing circuitry;
    a memory coupled to said processing circuitry; and
    a device as defined in claim 1 coupled to the processing circuitry and the memory.

21. A printed circuit board on which is mounted a device as defined in claim 1.

22. The printed circuit board defined in claim 21 further comprising:
    a memory mounted on the printed circuit board and coupled to the device.

23. The printed circuit board defined in claim 21 further comprising:
    processing circuitry mounted on the printed circuit board and coupled to the device.

24. The device defined in claim 1 wherein the high speed serial interface circuitry comprises one of a plurality of channels of high speed serial interface circuitry, each adapted to receive a respective one of a plurality of high speed serial data signals and to convert that signal to a plurality of parallel data signals suitable for application to the programmable logic circuitry, and each including programmably controllable routing circuitry adapted to select which of a plurality of functions available in the high speed serial interface circuitry will be performed on the high speed serial data signal to convert it to the plurality of parallel data signals, at least one of the functions being selected from the group consisting of pattern detection, 10 bit to 8 bit decoding, channel alignment, and 8 bit to 10 bit encoding.

25. The device defined in claim 24 wherein the functions available in the high speed serial interface circuitry include clock data recovery, deserialization, pattern detection, 10 bit to 8 bit decoding, rate matching, and channel alignment.

26. The device defined in claim 25 wherein the functions available in the high speed serial interface circuitry further include byte deserialization.

27. The device defined in claim 25 wherein the functions available in the high speed serial interface circuitry further include character deletion and character insertion.

28. The device defined in claim 24 wherein each of the channels is further adapted to receive a respective plurality of further parallel data signals from the programmable logic circuitry and to convert those signals to a high speed serial data output signal.

29. The device defined in claim 28 wherein the functions available in the high speed serial interface circuitry further include 8 bit to 10 bit encoding and serialization.

30. The device defined in claim 29 wherein the functions available in the high speed serial interface circuitry further include byte serialization.

* * * * *